(12) United States Patent  
Rosen et al.

(10) Patent No.: US 12,231,134 B2
(45) Date of Patent: *Feb. 18, 2025

(54) METHOD AND APPARATUS FOR CONTROLLING CLOCK CYCLE TIME

(71) Applicant: Marvell Asia Pte, Ltd., Singapore (SG)

(72) Inventors: Eitan Rosen, Abirim (IL); Oded Norman, Pardesia (IL)

(73) Assignee: Marvell Asia Pte, Ltd., Singapore (SG)

( * ) Notice: Subject to any disclaimer, the term of this patent is extended or adjusted under 35 U.S.C. 154(b) by 0 days.

This patent is subject to a terminal disclaimer.

(21) Appl. No.: 18/434,225

(22) Filed: Feb. 6, 2024

(65) Prior Publication Data

US 2024/0178849 A1    May 30, 2024

Related U.S. Application Data

(63) Continuation of application No. 18/061,177, filed on Dec. 2, 2022, now Pat. No. 11,936,394, which is a continuation of application No. 17/679,999, filed on Feb. 24, 2022, now Pat. No. 11,545,988, which is a continuation of application No. 17/215,862, filed on Mar. 29, 2021, now Pat. No. 11,296,712, which is a continuation of application No. 16/887,963, filed on May 29, 2020, now Pat. No. 10,998,910.

(Continued)

(51) Int. Cl.
| | |
|---|---|
| H03K 3/03 | (2006.01) |
| H03K 5/13 | (2014.01) |
| H03L 5/00 | (2006.01) |
| H03L 7/099 | (2006.01) |
| H03L 7/16 | (2006.01) |

(52) U.S. Cl.
CPC .............. *H03L 7/16* (2013.01); *H03K 3/0315* (2013.01); *H03K 5/13* (2013.01); *H03L 5/00* (2013.01); *H03L 7/0995* (2013.01); *H03L 7/0996* (2013.01)

(58) Field of Classification Search
CPC ...... H03K 3/0315; H03K 3/0322; H03K 5/13; H03K 5/131; H03K 5/133; H03K 5/134; H03K 5/135; H03K 5/14; H03L 7/0995; H03L 7/0996; H03L 7/16
USPC .......................................................... 331/57
See application file for complete search history.

(56) References Cited

U.S. PATENT DOCUMENTS

| | | |
|---|---|---|
| 5,781,056 A | 7/1998 | Fujii |
| 6,104,326 A | 8/2000 | Lee et al. |

(Continued)

*Primary Examiner* — Levi Gannon
(74) *Attorney, Agent, or Firm* — Hamilton, Brook, Smith & Reynolds, P.C.

(57) ABSTRACT

A circuit and corresponding method control cycle time of an output clock used to clock at least one other circuit. The circuit comprises an agile ring oscillator (ARO) and ARO controller. The ARO includes at least one instance of a first ring oscillator (RO) and second RO that generate high and low phases, respectively, of cycles of the output clock. The ARO controller controls durations of the high and low phases, independently, via first and second control words output to the ARO, respectively. In a present cycle of the output clock, the ARO controller effects a change to the high or low phase, or a combination thereof, in a next cycle of the output clock by updating the first or second control word, or a combination thereof, based on an indication of expected usage of the at least one other circuit in the next cycle. The change improves a performance-to-power ratio of the at least one other circuit.

35 Claims, 10 Drawing Sheets

Related U.S. Application Data

(60) Provisional application No. 62/975,073, filed on Feb. 11, 2020.

(56) References Cited

U.S. PATENT DOCUMENTS

| | | |
|---|---|---|
| 6,204,694 B1 | 3/2001 | Sunter et al. |
| 6,388,533 B2 | 5/2002 | Swaboda |
| 8,354,857 B1 | 1/2013 | Rosen |
| 9,088,288 B1 | 7/2015 | Rosen |
| 9,106,233 B1 | 8/2015 | Rosen |
| 9,467,092 B1 | 10/2016 | Dreps et al. |
| 9,490,817 B1 | 11/2016 | Rosen |
| 9,584,136 B1 | 2/2017 | Rosen |
| 9,762,241 B1 | 9/2017 | Augustine et al. |
| 9,973,331 B1 | 5/2018 | Rosen |
| 10,734,977 B1 | 8/2020 | Yu et al. |
| 10,998,910 B1 | 5/2021 | Rosen |
| 11,296,712 B2 | 4/2022 | Rosen et al. |
| 11,545,988 B2 | 1/2023 | Rosen et al. |
| 11,936,394 B2 | 3/2024 | Rosen et al. |
| 2002/0017946 A1 | 2/2002 | Fujii et al. |
| 2008/0136400 A1 | 6/2008 | Chi et al. |
| 2010/0164583 A1 | 7/2010 | Chen et al. |
| 2016/0277025 A1 | 9/2016 | Tanamoto et al. |
| 2017/0141762 A1 | 5/2017 | Uemura et al. |
| 2018/0196641 A1 | 7/2018 | Aoyagi |
| 2021/0250032 A1 | 8/2021 | Eitan et al. |
| 2022/0247417 A1 | 8/2022 | Eitan et al. |
| 2023/0114027 A1 | 4/2023 | Rosen et al. |

METHOD AND APPARATUS FOR CONTROLLING CLOCK CYCLE TIME

RELATED APPLICATIONS

This application is a continuation of U.S. application Ser. No. 18/061,177, filed Dec. 2, 2022, now U.S. Pat. No. 11,936,394, which is a continuation of U.S. application Ser. No. 17/679,999, filed Feb. 24, 2022, now U.S. Pat. No. 11,545,988, which is a continuation of U.S. application Ser. No. 17/215,862, filed Mar. 29, 2021, now U.S. Pat. No. 11,296,712, which is a continuation of U.S. application Ser. No. 16/887,963, filed on May 29, 2020, now U.S. Pat. No. 10,998,910, which claims the benefit of U.S. Provisional Application No. 62/975,073, filed on Feb. 11, 2020. The entire teachings of the above applications are incorporated herein by reference.

BACKGROUND

There are many different types of clock generators. One type of clock generator is a phase-locked loop (PLL). A PLL is a negative feedback system that locks a phase and frequency of a higher frequency device, usually a voltage controlled oscillator (VCO), whose phase and frequency are not very stable over temperature and time, to a more stable and lower frequency device, usually a temperature compensated or oven controlled crystal oscillator. A PLL is typically employed when there is a need for a high frequency local oscillator (LO) source. A PLL is useful for distributing precisely timed clock pulses in digital logic circuits, such as microprocessors. Since a single integrated circuit (IC) can provide a complete phase-locked-loop building block, the technique is widely used in modern electronic devices, with output frequencies from a fraction of a hertz up to many gigahertz.

Another type of clock generator is a ring oscillator (RO). A conventional RO can be formed by connecting an odd number of inverting gates in a ring shape. In such a configuration, the inverting gates are configured in a chain and an output of a last inverting gate in the chain is fed back into an input of a first inverting gate in the chain. The RO self-oscillates and an oscillation signal may be obtained from an output node of an arbitrary inverting gate in the chain. A frequency of the oscillation signal is based on the number of inverting gates in the chain and delay time of each inverting gate.

SUMMARY

According to an example embodiment, a circuit comprises an agile ring oscillator (ARO) including at least one instance of a first ring oscillator (RO) and a second RO. The first and second ring oscillators are configured to generate high and low phases, respectively, of cycles of an output clock used to clock at least one other circuit. The circuit further comprises an ARO controller configured to (i) control durations of the high and low phases, independently, via first and second control words output to the ARO, respectively, and (ii) in a present cycle of the output clock, effect a change to the high or low phase, or a combination thereof, in a next cycle of the output clock by updating the first or second control word, or a combination thereof, based on an indication of expected usage of the at least one other circuit in the next cycle.

Effecting the change in the next cycle improves a performance-to-power ratio of the at least one other circuit, relative to not effecting the change, by altering a period (i.e., cycle time) of the output clock, temporarily. The period is altered by changing a respective target count of signal inversions of a respective signal propagated in the first RO, second RO, or a combination thereof.

The indication may be generated by an instruction decoder of a processor. The indication represents expected activity or inactivity of the at least one circuit expected in the next cycle. The indication is generated in the present cycle.

The circuit may further comprise the instruction decoder. The instruction decoder is configured to identify instructions to be executed by the at least one other circuit. The indication represents whether the at least one other circuit will be executing at least one instruction in the next cycle.

The output clock is associated with a target frequency. In an event the indication indicates that the at least one other circuit is expected to be active in the next cycle, the change may cause a frequency of the output clock to be lower or higher than the target frequency by altering a period of the output clock in the next cycle by changing a respective target count of signal inversions of a respective signal propagated in the first RO, second RO, or a combination thereof.

The ARO controller may be further configured to maintain first and second calibration control words for updating the first and second control words, respectively, to cause the ARO to generate the output clock with a target frequency. The ARO controller may be further configured to maintain first and second slower control words for configuring the first and second control words, respectively, to cause the ARO to generate the output clock with a slower frequency that is slower relative to the target frequency.

The ARO controller may be further configured to relax timing, in the next cycle, by updating, in the present cycle, the first and second control words to be the first and second slower control words, respectively, causing a cycle time of the output clock to increase in the next cycle.

In an event the indication changes state in the present cycle and the first and second control words are configured, in the present cycle, as the first and second calibration control words, respectively, the ARO controller may be further configured to update the first and second control words to be the first and second slower control words, respectively.

In an event the indication changes state in the present cycle and the first and second control words are, presently, configured to be the first and second slower control words, respectively, the ARO controller may be further configured to update the first and second control words, in the present cycle, to the first and second calibration control words, respectively.

The ARO controller may be further configured to adjust the first and second calibration control words based on a calibration cycle and update the first and second control words to the first and second calibration control words, respectively, in response to such adjustment and based on the indication.

The ARO controller may include a calibration counter. The ARO controller may be further configured to reset and reload the calibration counter with a target reference count at a start of the calibration cycle. The target reference count may be based on the target frequency and a time window between the start of the calibration cycle and an end of the calibration cycle. The calibration counter may be configured to be triggered by the output clock. The first and second calibration control words may be adjusted based on a value of the calibration counter at the end of the calibration cycle.

The slower frequency may represent a slowest frequency for a given voltage below which the least one other circuit is unable to perform its intended function at the given voltage.

The circuit may be integrated together with the at least one other circuit in an integrated circuit (IC) macro of an IC chip. The at least one other circuit may be a slowest circuit operating on the IC chip, that is, the at least one other circuit may operate at a slowest frequency relative to other circuits on the IC chip. It should be understood, however, that the circuit is not limited to being integrated together with at least one other circuit that operates at the slowest frequency.

The first RO may be used to reset and enable the second RO and the second RO may be used to reset and enable the first RO.

The first RO may include a first plurality of inverting gates formed in a first ring. The first RO may be coupled to a first multiplexer. The first multiplexer may be coupled to a first counter configured to generate a first done signal. The first RO, first multiplexer, and first counter may, in combination, be configured to count a first target number of inversions propagated along the first plurality of inverting gates. The first multiplexer may be configured to select a given first inverting gate of the plurality of first inverting gates based on the first control word. The given first inverting gate may be selected to trigger the first counter.

The second RO may include a second plurality of inverting gates formed in a second ring. The second RO may be coupled to a second multiplexer. The second multiplexer may be coupled to a second counter configured to generate a second done signal. The second RO, second multiplexer, and second counter may, in combination, be configured to count a second target number of inversions propagated along the second plurality of inverting gates. The second multiplexer may be configured to select a given second inverting gate of the plurality of second inverting gates based on the second control word. The given second inverting gate may be selected to trigger the second counter.

The ARO may be further configured to employ the first done signal to reset the second RO and cause the second counter to be reset and re-loaded with the second target number. The ARO may be further configured to employ the second done signal to reset the first RO and cause the first counter to be reset and re-loaded with the first target number. The first and second target numbers may be configured based on a target frequency for the at least one other circuit.

The first and second counters may be down counters. It should be understood, however, that the first and second counters are not limited to being down counters and could, for example, be up counters or a combination of up and down counters.

The ARO may further include a clock output circuit configured to output the output clock based on the first and second done signals.

The at least one other circuit has a single clock domain.

The at least one instance may include a first instance and a second instance, wherein the first and second instances have different voltage scaling characteristics.

The ARO is a functional ARO, wherein the output clock to the at least one other circuit is sourced by the functional ARO. The first instance may be associated with a first voltage scaling characteristic, the second instance may be associated with a second voltage scaling characteristic, and the circuit may further include a first shadow ARO and a second shadow ARO. The first shadow ARO may replicate the functional ARO and the second shadow ARO may replicate the functional ARO. The first instance that is associated with the first voltage scaling characteristic and replicated in the first shadow ARO may be disabled in the first shadow ARO and the second instance that is associated with the second voltage scaling characteristic and replicated in the second shadow ARO may be disabled in the second shadow ARO.

The ARO controller may be further configured to employ the first shadow ARO to calibrate respective control words sent to the functional ARO for controlling inversion delay in the first instance for achieving a target frequency and employ the second shadow ARO to calibrate respective control words sent to the functional ARO for controlling inversion delay in the second instance for achieving the target frequency.

The ARO controller may employ a first pair of counters associated with the first shadow ARO and a second pair of counters associated with the second shadow ARO.

The ARO controller may be further configured to toggle between use of the first shadow ARO and the second shadow ARO on a calibration-window-by-calibration window basis.

According to another example embodiment, a method comprises controlling durations of high and low phases, independently, of cycles of an output clock via first and second control words, respectively. The first and second control words are output to an agile ring oscillator (ARO) in a circuit. The output clock is output by the ARO to at least one other circuit. The ARO includes at least one instance of a first ring oscillator (RO) and a second RO. The first and second ring oscillators are used for generating the high and low phases, respectively. The method comprises, in a present cycle of the output clock, effecting a change to the high or low phase, or a combination thereof, in a next cycle of the output clock by updating the first or second control word, or a combination thereof, based on an indication of expected usage of the at least one other circuit in the next cycle.

Alternative method embodiments parallel those described above in connection with the example circuit embodiments.

According to another example embodiment, a system comprises a circuit that includes a plurality of agile ring oscillators (AROs) each including at least one respective instance of a first ring oscillator (RO) and a second RO. The first and second ring oscillators are configured to generate high and low phases, respectively, of cycles of a respective output clock used to clock at least one other respective circuit. The circuit includes a plurality of agile ring oscillator (ARO) controllers each configured to (i) control durations of the high and low phases of a respective ARO of the plurality of AROs, the durations controlled, independently, via first and second control words output to the respective ARO, respectively, and (ii) in a present cycle of the output clock, effect a change to the high or low phase, or a combination thereof, in a next cycle of the respective output clock by updating the first or second control word, or a combination thereof, based on a respective indication of expected usage of the respective at least one other circuit in the next cycle.

The system may be an integrated circuit (IC) chip.

Alternative system embodiments parallel those described above in connection with the example circuit and method embodiments.

It should be understood that example embodiments disclosed herein can be implemented in the form of a method, apparatus, system, or computer readable medium with program codes embodied thereon.

BRIEF DESCRIPTION OF THE DRAWINGS

The foregoing will be apparent from the following more particular description of example embodiments, as illustrated in the accompanying drawings in which like reference characters refer to the same parts throughout the different views. The drawings are not necessarily to scale, emphasis instead being placed upon illustrating embodiments.

DETAILED DESCRIPTION

Figure 1:
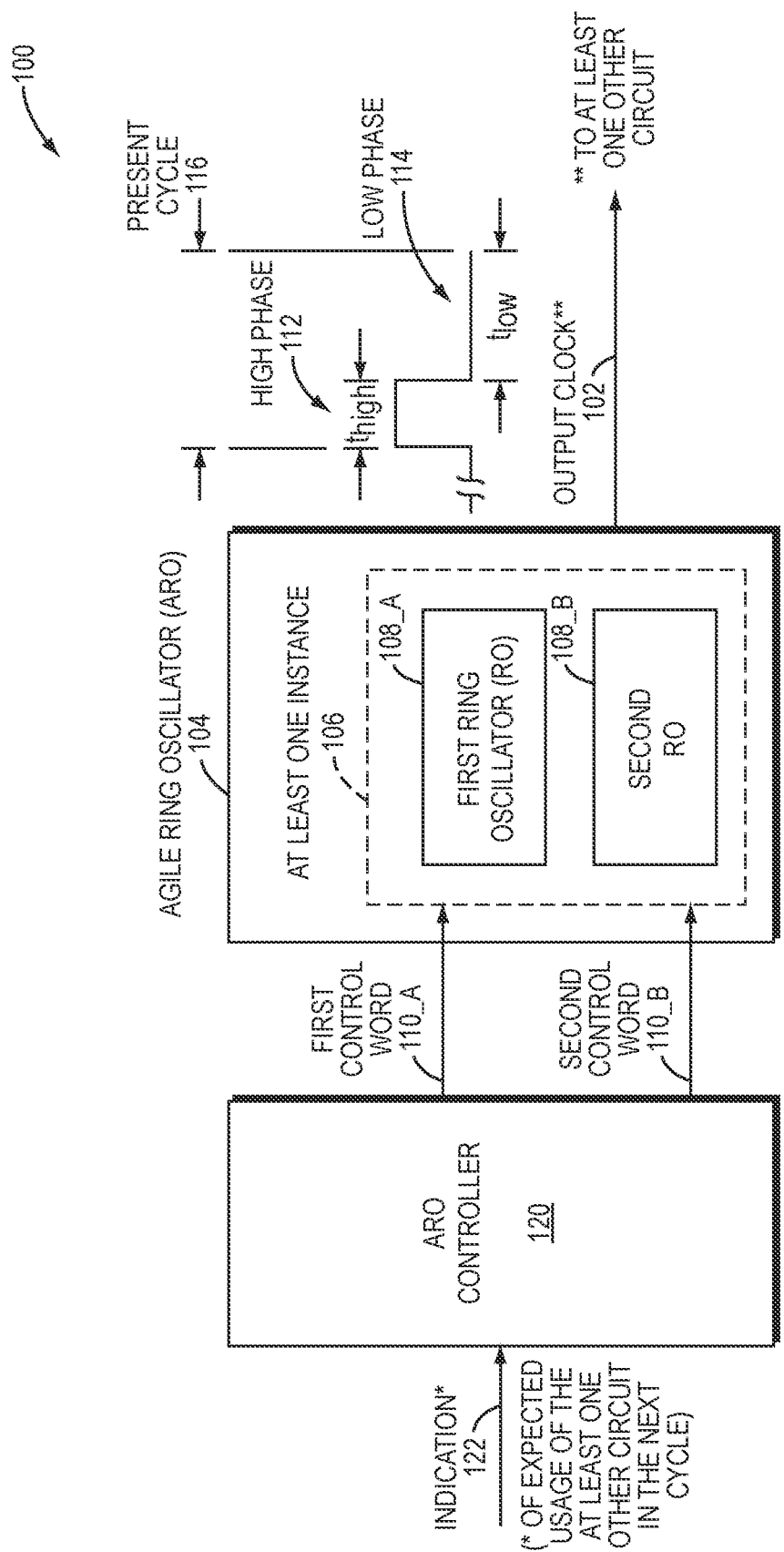
FIG. 1 is a block diagram of an example embodiment of a circuit for controlling cycle time of an output clock.

A description of example embodiments follows.

A clock generator that is based on a phase-locked loop (PLL) generates a clock signal with reference to an oscillation signal having a relatively stable frequency, such as an oscillation signal generated by a crystal oscillator external to an integrated circuit (IC) chip. The PLL-based clock generator lacks flexibility with respect to environmental changes, such as process, voltage, and temperature (PVT) changes of the IC chip. With a PLL, all cycles of a clock generated therefrom are fixed to a same period (i.e., cycle time).

According to an example embodiment, an agile ring oscillator (ARO), such as the ARO 104 of FIG. 1, disclosed further below, may be employed in a circuit to generate a clock for use as a clock signal in at least one other circuit. The at least one other circuit may be a unit, pipe stage of a unit, processor core, plurality (e.g., cluster) of processor cores, or any other payload macro. In contrast to a PLL, the ARO does not phase lock and a cycle time of the clock generated therefrom is variable instead of fixed.

The ARO is a ring oscillator (RO) that is "agile" because the cycle time (i.e., period) of the clock generated therefrom may vary from cycle-to-cycle and is not fixed. Cycles of a clock generated by the ARO may be varied, cycle-to-cycle, by varying a number of inversions, cycle-to-cycle, per high and low phase, as disclosed further below with regard to FIG. 1. Such cycle time may be varied from cycle-to-cycle based on a priori knowledge of expected usage of the at least one other circuit, advantageously effecting a performance-to-power ratio of the at least one other circuit.

According to an example embodiment, the ARO may be employed to improve a performance/power ratio of the at least one other circuit by varying its clock based on whether the at least one other circuit is used frequently or infrequently. According to an example embodiment, the ARO may vary the cycle time of the clock from cycle-to-cycle to improve the performance/power ratio of the at least one other circuit based on a priori knowledge of expected usage of the at least one other circuit. By employing respective agile ring oscillators (AROs), different circuits, such as units or pipe stages, do not all need to be run at a same period and infrequently used units/pipe stages may be run slower or faster relative to other units/pipe stages.

For example, if, in a present cycle, it is known that an infrequently used pipe stage is to be utilized in a next cycle, then the ARO may slow down the clock to the infrequently used pipe stage for at least one cycle, by changing a number of inversions employed to generate the high phase, low phase, or combination thereof, of the clock in the next cycle, as disclosed further below. Further, the ARO may subsequently switch the number of inversions to a calibrated number based on a priori knowledge that such expected usage will change. The calibrated number is based on a target operational frequency, as disclosed further below. Such a temporary adjustment to the cycle time enables a savings with respect to leakage power and, while performance of the at least one circuit may be reduced, temporarily, due to the slowdown, a reduction in overall power usage may be achieved, thereby improving a performance-to-power ratio of the at least one circuit over time.

According to an example embodiment, an instruction decoder, such as an instruction decoder of a processor that decodes instructions for execution by the processor, provides an indication to an ARO that represents a priori knowledge of expected usage of a unit/pipe stage(s) that employ a clock generated by the ARO. Based on the indication provided in a present cycle, cycle time of the output clock may be increased or decreased in a next cycle.

According to an example embodiment, infrequently used units/pipe stages may be run with longer periods. In contrast to running a circuit with a PLL clock that has a fixed period, a clock generated by an ARO may vary from cycle-to-cycle based on expected usage of the circuit(s) driven by the clock and has a programmable duty cycle that may be controlled from cycle-to-cycle. A clock output from the ARO tracks according to PVT changes that occur within its surroundings. For example, if the ARO is part of a macro of an IC chip and voltage of the macro increases, a period of the output clock of the ARO decreases. Conversely, if the voltage of the macro decreases, the period of the output clock of the ARO increases because the ARO may employ gates with similar PVT characteristics as employed by the macro.

In contrast to a PLL that may be designed to generate a clock with a fixed period that enables the circuit it drives to continue to operate at a lowest voltage the circuit will be operated at in view of noise on its voltage supply, etc., the period of the output clock from the ARO adjusts, automatically. For example, if the voltage supply voltage droops due to, for example, noise, the period of the clock generated by the ARO extends, automatically. As such, with an ARO, a margin around a frequency of manufacture is not needed, such as manufacturing an IC to run at 2.5 GHz and then rating the IC for operation at a lesser frequency, such as 2 GHz. FIG. 1, disclosed below, employs an ARO in a circuit for generating an output clock to at least one other circuit and a cycle time of the output clock may be advantageously varied on a cycle-by-cycle basis in response to PVT changes and a priori knowledge of expected usage of the at least one other circuit.

FIG. 1 is a block diagram of an example embodiment of a circuit 100 for controlling cycle time of an output clock 102. The circuit 100 comprises an agile ring oscillator (ARO) 104 that includes at least one instance 106 of a first ring oscillator (RO) 108_A and a second RO 108_B. The first RO 108_A and second RO 108_B are configured to generate high and low phases, respectively, of cycles of the output clock 102, such as the present cycle 116.

In the example embodiment, the first RO 108_A is responsible for generating the high phase 112 of the output clock 102 and the second RO 108_B is responsible for generating the low phase 114 of the output clock 102. The output clock 102 is used to clock at least one other circuit (not shown). The at least one other circuit may be referred to interchangeably herein as a payload macro. The at least one other circuit has a single clock domain that is asynchronous relative to its surroundings, as the ARO 104, providing the output clock 102, does not phase lock.

The at least one other circuit may be a unit, pipe stage of a unit, processor core, plurality of processor cores, or any other circuit or plurality of circuits that have a common, single clock domain. The circuit 100 further comprises an ARO controller 120 configured to (i) control durations of the high and low phases, independently, via the first control word 110_A and second control word 110_B that are output to the ARO 104, respectively, and (ii) in the present cycle 116 of the output clock 102, effect a change (not shown) to the high phase 112 or low phase 114, or a combination thereof, in a next cycle (not shown) of the output clock 102 by updating the first control word 110_A or second control word 110_B, or a combination thereof, based on an indication 122 of expected usage of the at least one other circuit in the next cycle.

Effecting the change in the next cycle improves a performance-to-power ratio of the at least one other circuit, relative to not effecting the change, by altering a period (i.e., cycle time) of the output clock 102, temporarily. For example, by allowing the at least one other circuit to run slower, that is, by increasing a period of the ARO clock driving same, power consumed by the at least one other circuit may be reduced. The period is altered by changing a respective target count of signal inversions of a respective signal propagated in the first RO, second RO, or a combination thereof, as disclosed below with regard to FIG. 2.

Figure 2:
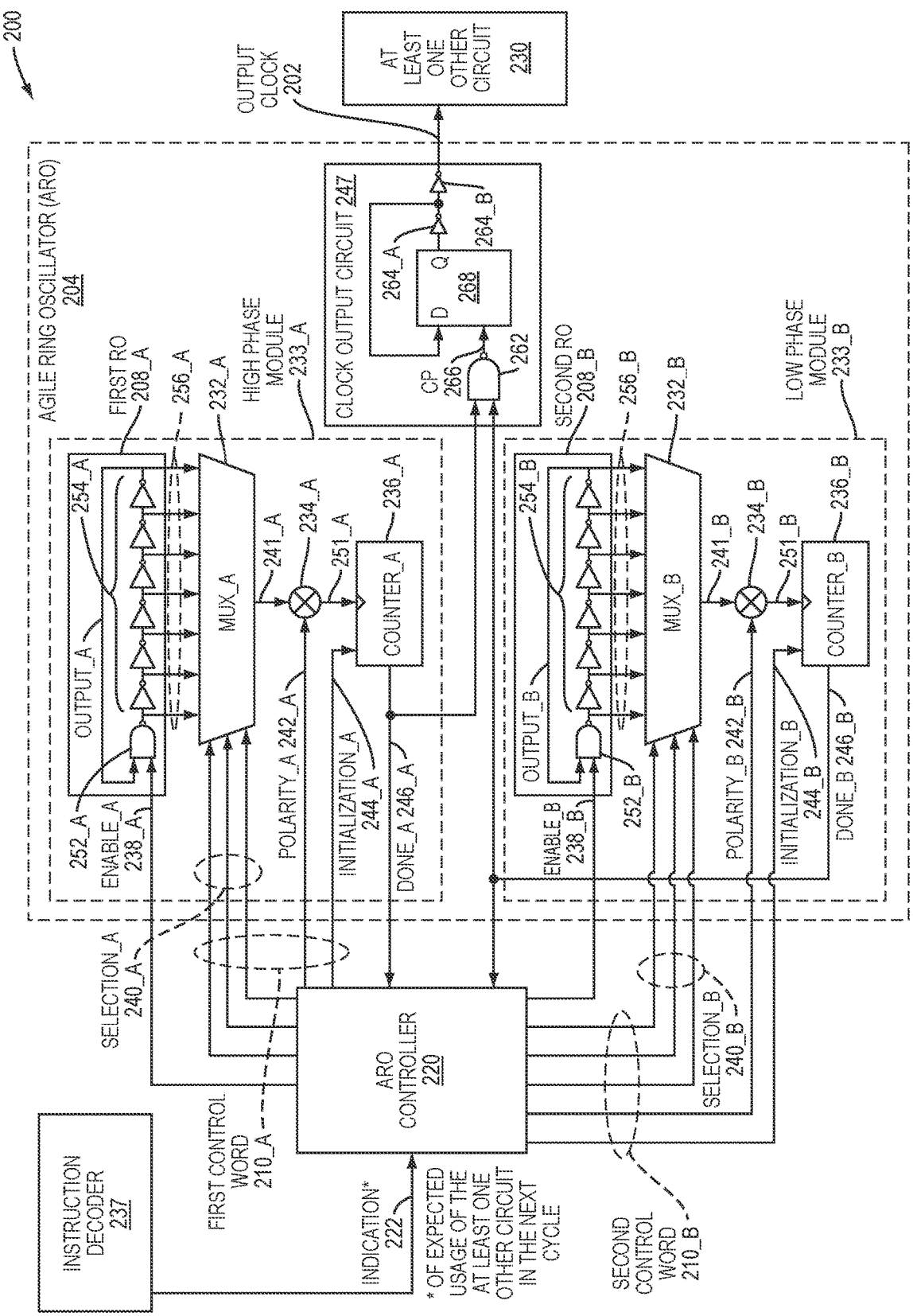
FIG. 2 is a circuit diagram of an example embodiment of the circuit of FIG. 1.

FIG. 2 is a circuit diagram of an example embodiment of a circuit 200 that may be employed as the circuit 100 of FIG. 1, disclosed above. The circuit 200 comprises an agile ring oscillator (ARO) 204 that includes at least one instance of a first ring oscillator (RO) and second RO, namely the first RO 208_A and second RO 208_B. The first RO 208_A and second RO 208_B are used to generate high and low phases, respectively, of cycles of the output clock 202.

In the example embodiment, the first RO 208_A is responsible for generating the high phase (not shown) of the output clock 202 and the second RO 208_B is responsible for generating the low phase (not shown) of the output clock 202. The output clock 202 is used to clock at least one other circuit 230. The at least one other circuit 230 may be referred to interchangeably herein as a payload macro. The at least one other circuit 230 has a single clock domain that is asynchronous relative to its surroundings, as the ARO 204, providing the output clock 202, does not phase lock. According to an example embodiment, the circuit 200 may be integrated together with the at least one other circuit 230 in an integrated circuit (IC) macro of an IC chip (not shown).

The circuit 200 further comprises an ARO controller 220 configured to (i) control durations of the high and low phases, independently, via a first control word 210_A and second control word 210_B that are output to the ARO 204, respectively, and (ii) in the present cycle of the output clock 202, effect a change (not shown) to the high phase or low phase, or a combination thereof, in a next cycle of the output clock 202 by updating the first control word 210_A or second control word 210_B, or a combination thereof, based on an indication 222 of expected usage of the at least one other circuit 230 in the next cycle.

In the example embodiment of FIG. 2, the circuit 200 further comprises an instruction decoder 237 that is configured to decode instructions to be executed, for example, by a processor (not shown). The instruction decoder 237 is configured to determine which of the instructions are to be executed by the at least one other circuit 230. The instruction decoder 237 is configured to generate the indication 222 that represents expected activity or inactivity of the at least one other circuit 230 expected in the next cycle based on decoding instructions. As such, the instruction decoder 237 is configured to identify instructions (not shown) to be executed by the at least one other circuit 230. The indication 222 represents whether the at least one other circuit 230 will be executing at least one instruction in the next cycle.

According to an example embodiment, the ARO controller 220 may update the first control word 210_A to be either a first calibration control word (not shown) or a first slower control word (not shown) based on the indication 222. The first calibration control word and first slower control word are disclosed further below with regard to FIG. 3. The first calibration control word may be referred to as a first dynamic control word as it is updated on a calibration-cycle-by-calibration-cycle basis, as disclosed further below with regard to FIG. 3. The first slower control word may be referred interchangeably herein as a first static control word as it may not change during run-time operation of the circuit 200.

Similarly, the ARO controller 220 may update the second control word 210_B to be either a second calibration control word (not shown) or a second slower control word (not shown). The second calibration control word and second slower control word are disclosed further below with regard to FIG. 3. The second calibration control word may be referred to as a second dynamic control word as it is updated on a calibration-cycle-by-calibration-cycle basis, as disclosed further below with regard to FIG. 3. The second slower control word may be referred interchangeably herein as a second static control word as it may not change during run-time operation of the circuit 200.

According to an example embodiment, the ARO controller updates the first control word 210_A and second control word 210_B to the first and second calibration control words, respectively, or the first and second slower control words, respectively, in the present cycle, based on a level or detected transition of the indication 222 in the present cycle. Such an update may cause a change to the high phase, low phase, or a combination thereof, of the output clock 202 in the next cycle relative to phases of the output clock in the present cycle. It should be understood that the next cycle follows the present cycle in time.

The first control word 210_A includes respective settings for a first selection signal 240_A (i.e., SELECTION_A), first polarity signal 242_A (i.e., POLARITY_A), and first initialization signal 244_A (i.e., INITIALIZATION_A), disclosed below. Similarly, the second control word 210_B includes respective settings for a second selection signal 240_B (i.e., SELECTION_B), second polarity signal 242_B (i.e., POLARITY_B), and second initialization signal 244_B (i.e., INITIALIZATION_B), disclosed further below.

In the example embodiment of FIG. 2, the ARO 204 further includes a first multiplexer module 232_A, first XOR module 234_A, and first counter module 236_A which, in combination with the first RO 208_A, may be referred to herein as a high phase module 233_A. The ARO 204 further includes a second multiplexer module 232_B, second XOR module 234_B, and second counter module 236_B which, in combination with the second RO 208_B, may be referred to herein as a low phase module 233_B. The elements of the high phase module 233_A and low phase module 233_B may be coupled together as shown in FIG. 2.

The high phase module 233_A is configured to count unidirectional transitions that occur at an output of the first ring oscillator 208_A, that is, OUTPUT_A. Such unidirectional transitions are shifted by a configurable number of inversions defined by the first control word 210_A. Such unidirectional transitions may be rising edge transitions. Alternatively, such unidirectional transitions may be falling edge transitions. Such a count of unidirectional transitions represents a count of inversions propagated in the first ring oscillator 208_A and the high phase module 233_A may be configured to count such unidirectional transitions up to a first target number, that is, a first target count of signal inversions. The first target number is defined by the first selection signal 240_A, first polarity signal 242_A, and first initialization signal 244_A, that is, the first target number is defined by the first control word 210_A. During operation, when the first RO 208_A is enabled, the high phase module 233_A starts counting inversions propagated in the first RO 208_A. When the counted number of inversions reaches the first target number, the high phase module 233_A outputs the first done signal 246_A that represents the first target number being reached.

Similarly, the low phase module 233_B is configured to count unidirectional transitions that occur at an output of the second ring oscillator 208_B, that is, OUTPUT_B. Such unidirectional transitions are shifted by a configurable number of inversions defined by the second control word 210_B. Such unidirectional transitions may be rising edge transitions. Alternatively, such unidirectional transitions may be falling edge transitions. Such a count of unidirectional transitions represents a count of inversions propagated in the second ring oscillator 208_B and the low phase module 233_B may be configured to count such unidirectional transitions up to a second target number, that is, a second target count of signal inversions. The second target number is defined by the second selection signal 240_B, second polarity signal 242_B, and second initialization signal 244_B, that is, the second target number is defined by the second control word 210_B. During operation, when the second RO 208_B is enabled, the low phase module 233_B starts counting inversions propagated in the second RO 208_B. When the counted number of inversions reaches the second target number, the low phase module 233_B outputs the second done signal 246_B that represents the second target number being reached.

The output clock 202 is associated with a target frequency. In an event the indication 222 indicates that the at least one other circuit 230 is expected to be active in the next cycle, the change may cause a frequency of the output clock 202 to be lower or higher than the target frequency by altering a period of the output clock 202 in the next cycle by changing a respective target count of signal inversions, such as the first target number and/or second target number, disclosed above, of a respective signal propagated in the first RO 208_A, second RO 208_B, or a combination thereof. The respective target number of inversions may be con-trolled via a calibration process, such as disclosed further below, and, in addition to PVT dependent delay, employed to alter the frequency.

The first control word 210_A and second control word 210_B that are output to the ARO 204, respectively, in the present cycle of the output clock 202, effect a change to the high phase or low phase, or a combination thereof, in a next cycle of the output clock 202 by updating the first control word 210_A or second control word 210_B, or a combination thereof, based on the indication 222 of expected usage of the at least one other circuit 230 in the next cycle.

The first RO 208_A and second RO 208_B are N-stage ring oscillators (ROs). The first RO 208_A receives a first enable signal 238_A (i.e., ENABLE_A) from the ARO controller 220 and outputs a first plurality of inversion signals 256_A. The second RO 208_B receives a second enable signal 238_B (i.e., ENABLE_B) from the ARO controller 220 and outputs a second plurality of inversion signals 256_B.

The first enable signal 238_A enables or disables the N-stage first RO 208_A and the second enable signal 238_B enables or disables the N-stage second RO 208_B. In the example embodiment of FIG. 2, the first RO 208_A and second RO 208_B are seven-stage ring oscillators. It should be understood, however, that a number of inversion stages of the first and second ring oscillators is not limited to seven. Further, a number of inversion stages of the first and second ring oscillators may be a same number of inversion stages or a different number.

In the example embodiment, the first RO 208_A is a seven-stage ring oscillator that includes seven inversion gates, namely a NAND gate 252_A and six inverters 254_A formed in a ring. Similarly, the second RO 208_B is a seven-stage ring oscillator that includes seven inversion gates, namely a NAND gate 252_B and six inverters 254_B formed in a ring. It should be understood, however, that inversion gates of the first RO 208_A and second RO 208_B are not limited to the types of inversion gates of FIG. 2 or the number of inversion gates of FIG. 2. For example, seven two-input NAND gates may be employed, a combination of NAND and inverters may be employed, and a number of such inversion gates is not limited to seven.

In the example embodiment, when the first enable signal 238_A is logic "0," the first RO 208_A stops oscillating and when the enable signal 238_A is logic "1," the first RO 208_A starts oscillating. Each inversion stage of the first RO 208_A provides a respective inversion signal of the plurality of first inversion signals 256_A. The first inversion signals 256_A are provided to the first multiplexer module 232_A. Similarly, when the second enable signal 238_B is logic "0," the second RO 208_B stops oscillating and when the enable signal 238_B is logic "1," the second RO 208_B starts oscillating. Each inversion stage of the second RO 208_B provides a respective inversion signal of the plurality of second inversion signals 256_B to the second multiplexer module 232_B.

The first multiplexer module 232_A receives the plurality of first inversion signals 256_A from the first RO 208_A and the first selection signal 240_A (i.e., SELECTION_A) from the ARO controller 220. The first selection signal 240_A indicates which of the inversion signals 256_A is to be selected by the first multiplexer module 232_A. Based on the first selection signal 240_A, the first multiplexer module 232_A selects a given first inversion signal of the plurality of first inversion signals 256_A. In the example embodiment of FIG. 2, the first multiplexer module 232_A receives seven inversion signals 256_A from the first RO 208_A and receives a 3-bit first selection signal 240_A from the ARO controller 220. Based on the 3-bit first selection signal 240_A, the first multiplexer module 232_A selectively outputs the given first inversion signal selected from the plurality of first inversion signals 256_A as a selected first inversion signal 241_A. It should be understood that the first selection signal 240_A is not limited to 3-bits.

The first XOR module 234_A receives the selected first inversion signal 241_A and the first polarity signal 242_A (i.e., POLARITY_A) from the ARO controller 220, executes an XOR operation of the selected first inversion signal 241_A and the first polarity signal 242_A to generate a first counter trigger signal 251_A, and provides the first counter trigger signal 251_A to the first counter module 236_A. The first polarity signal 242_A is provided by the ARO controller 220 to adjust a transition direction of a target signal transition edge with regard to the first counter module 236_A.

According to an example embodiment, the first counter module 236_A is rising edge triggered. When the target signal transition edge at an inversion stage of the first RO 208_A is a rising edge, the ARO controller 220_A provides "0" as the first polarity signal 242_A. However, when the target signal transition edge is a falling edge, the ARO controller 220 provides "1" as the first polarity signal 242_A. It is noted that when the first counter module 236_A is falling-edge triggered, the first polarity signal 242_A can be suitably adjusted to change the transition direction of the target signal transition edge to be a falling edge.

The first counter module 236_A is reset and re-loaded based on the first initialization signal 244_A (i.e., INITIALIZATION_A) received from the ARO controller 220. The first counter module 236_A counts transitions (rising edges or falling edges) in the first counter trigger signal 251_A, detects the target signal transition edge, and provides a first done signal 246_A (i.e., DONE_A) to the ARO controller 220 and a clock output circuit 247 (also referred to interchangeably herein as a core mux) based on the detection, causing a high phase of the output clock 202 to transition to a low phase, as disclosed further below.

According to an example embodiment, in response to assertion of the first done signal 246_A, the ARO controller 220 disables the first RO 208_A from oscillating via the first enable signal 238_A and causes the second RO 208_B to start oscillating via the second enable signal 238_B. The ARO controller 220 further resets and re-loads the second counter module 236_B by providing the second initialization signal 244_B (i.e., INITIALIZATION_B) to the second counter module 260.

The second multiplexer module 232_B receives the plurality of second inversion signals 256_B from the second RO 208_B and the second selection signal 240_B (i.e., SELECTION_B) from the ARO controller 220. The second selection signal 240_B indicates which of the second inversion signals 256_B is to be selected by the second multiplexer module 232_B. Based on the second selection signal 240_B, the second multiplexer module 232_B selects a given second inversion signal of the plurality of second inversion signals 256_B. In the example embodiment of FIG. 2, the second multiplexer module 232_B receives seven inversion signals 256_B from the second RO 208_B and receives a 3-bit second selection signal 240_B from the ARO controller 220. Based on the 3-bit second selection signal 240_B, the second multiplexer module 232_B selectively outputs a given second inversion signal of the plurality of second inversion signals 256_B as a selected second inversion signal 241_B.

The second XOR module 234_B receives the selected second inversion signal 241_B and the second polarity signal 242_B (i.e., POLARITY_B) from the ARO controller 220, executes an XOR operation of the selected second inversion signal 241_B and the second polarity signal 242_B to generate a second counter trigger signal 251_B, and provides the second counter trigger signal 251_B to the second counter module 236_B. The second polarity signal 242_B is provided by the ARO controller 220 to adjust a transition direction of a target signal transition edge with regard to the second counter module 236_B.

According to an example embodiment, the second counter module 236_B is rising edge triggered. When the target signal transition edge at an inversion stage of the second RO 208_B is a rising edge, the ARO controller 220_B provides "0" as the second polarity signal 242_B. However, when the target signal transition edge is a falling edge, the ARO controller 220 provides "1" as the second polarity signal 242_B. It is noted that when the second counter module 236_B is falling-edge triggered, the second polarity signal 242_B may be adjusted to change the transition direction of the target signal transition edge to be a falling edge.

The second counter module 236_B is reset and re-loaded based on the second initialization signal 244_B (i.e., INITIALIZATION_B) received from the ARO controller 220. The second counter module 236_B counts transitions (rising edges or falling edges) in the second counter trigger signal 251_B, detects the target signal transition edge, and provides a second done signal 246_B (i.e., DONE_B) to the ARO controller 220 and the clock output circuit 247 based on the detection, causing a low phase of the output clock 202 to transition to a high phase, as disclosed further below.

According to an example embodiment, in response to assertion of the second done signal 246_B, the ARO controller 220 disables the second RO 208_B from oscillating via the second enable signal 238_B and enables the first RO 208_A to oscillate via the first enable signal 238_A. The ARO controller 220 resets the first counter module 236_A and provides the first initialization signal 244_A to the first counter module 236_A causing the first counter module 236_A to reset and re-load a respective counter such that the high phase duration may again be controlled via the high phase module 233_A, as disclosed above. As such, on a cycle-by-cycle basis, the high phase and the low phase of the output clock 202 are controlled based on the first control word 210_A and second control word 210_B, respectively.

As disclosed above, the first done signal 246_A and second done signal 246_B are input to the clock output circuit 247 of the ARO 204 and the output clock 202 is produced therefrom. The clock output circuit 247 includes an input NAND gate 262, a toggle D flip-flop (FF) 268 that changes its output state each time it is triggered by the clock CP 266. The Q output of the D FF 268 is provided to the D-input of the D FF 268 and a first inversion gate 264_A. The first inversion gate 264_A inverts the Q output and provides the Q output inverted to a second inversion gate 264_B that outputs the output clock 202 to the at least one other circuit 230.

It should be understood, however, that the clock output circuit 247 is not limited to the logic arrangement disclosed in FIG. 2 and may have alternative arrangements that may, for example, be generated via a register-transfer level (RTL) design tool. In the example embodiment of FIG. 2, the first done signal 246_A and second done signal 246_B are active low signals and a slower signal of the two signals determines the high phase of the output clock 202.

According to an example embodiment, the ARO controller 220 may be further configured to maintain first and second calibration control words for updating the first control word 210_A and second control word 201_B, respectively, to cause the ARO 204 to generate the output clock 202 with a target frequency. The ARO controller 220 may be further configured to maintain first and second slower control words for configuring the first control word 210_A and second control word 210_B, respectively, to cause the ARO 204 to generate the output clock 202 with a slower frequency that is slower relative to the target frequency, such as disclosed below with regard to FIG. 3.

Figure 3:
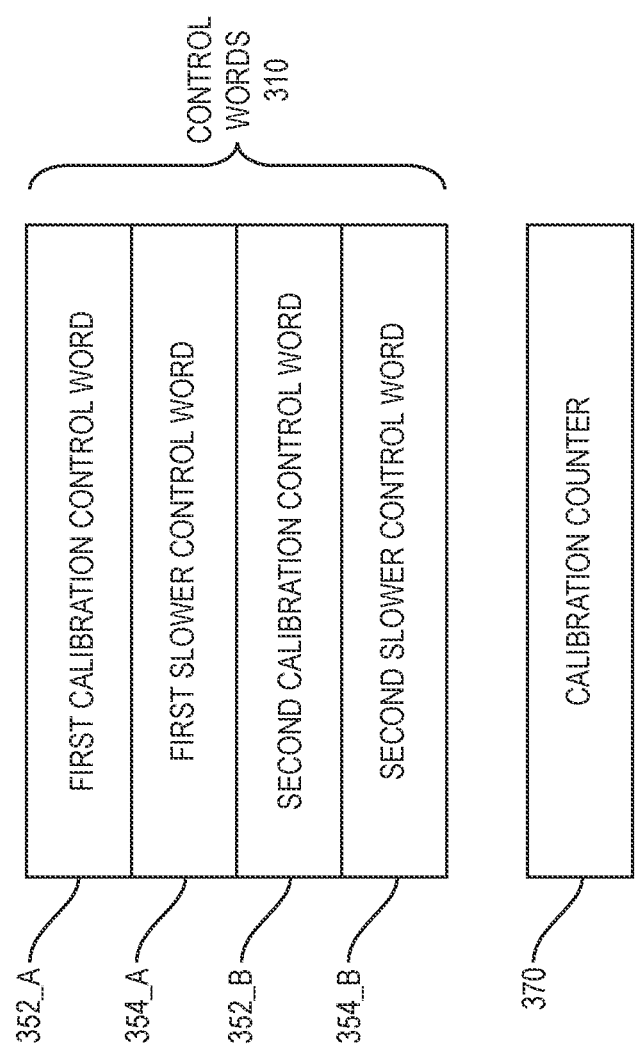
FIG. 3 is a block diagram of an example embodiment of control words and a calibration counter maintained by an agile ring oscillator (ARO) controller in an example embodiment.

FIG. 3 is a block diagram of an example embodiment of control words 310 and a calibration counter 370 that may be maintained by an ARO controller disclosed herein. The control words 310 include a first calibration control word 352_A, second calibration control word 352_B, first slower control word 354_A, and second slower control word 354_B. With reference to FIG. 2, disclosed above, and FIG. 3, the ARO controller 220 may be further configured to maintain the first calibration control word 352_A and second calibration control word 352_B for updating the first control word 210_A and second control word 210_B, respectively, to cause the ARO 204 to generate the output clock 202 with a target frequency (not shown). The ARO controller 220 may be further configured to maintain a first slower control word 354_A and second slower control word 354_B for configuring the first control word 210_A and second control word 210_B, respectively, to cause the ARO 204 to generate the output clock 202 with a slower frequency (not shown) that is slower relative to the target frequency.

The ARO controller 220 may be further configured to relax timing, in the next cycle, by updating, in the present cycle, the first control word 210_A and second control word 210_B to be the first slower control word 354_A and second slower control word 354_B, respectively, causing a cycle time of the output clock 202 to increase in the next cycle.

In an event the indication 222 changes state in the present cycle and the first control word 210_A and second control word 210_B are configured, in the present cycle, as the first calibration control word 352_A and second calibration control word 352_B, respectively, the ARO controller 220 may be further configured to update the first control word 210_A and second control word 210_B to be the first slower control word 354_A and second slower control word 354_B, respectively.

In an event the indication 222 changes state in the present cycle and the first control word 210_A and second control word 210_B are, presently, configured to be the first slower control word 354_A and second slower control word 354_B, respectively, the ARO controller 220 may be further configured to update the first control word 210_A and second control word 210_B, in the present cycle, to the first calibration control word 352_A and second calibration control word 352_B, respectively.

The ARO controller 220 may be further configured to adjust the first calibration control word 352_A and second calibration control word 352_B based on a calibration cycle (not shown) and to update the first control word 210_A and second control word 210_B to the first calibration control word 352_A and second calibration control word 352_B, respectively, in response to such adjustment and based on the indication 222.

The ARO controller may be further configured to reset and reload the calibration counter 370 with a target reference count (not shown) at a start of the calibration cycle. The target reference count may be based on the target frequency and a time window (not shown) between the start of the calibration cycle and an end of the calibration cycle. The calibration counter 370 may be configured to be triggered by the output clock 202. The first calibration control word 352_A and second calibration control word 352_B may be adjusted based on a value of the calibration counter 370 at the end of the calibration cycle.

The slower frequency may represent a slowest frequency for a given voltage (not shown) below which the least one other circuit 230 is unable to perform its intended function at the given voltage.

Figure 4:
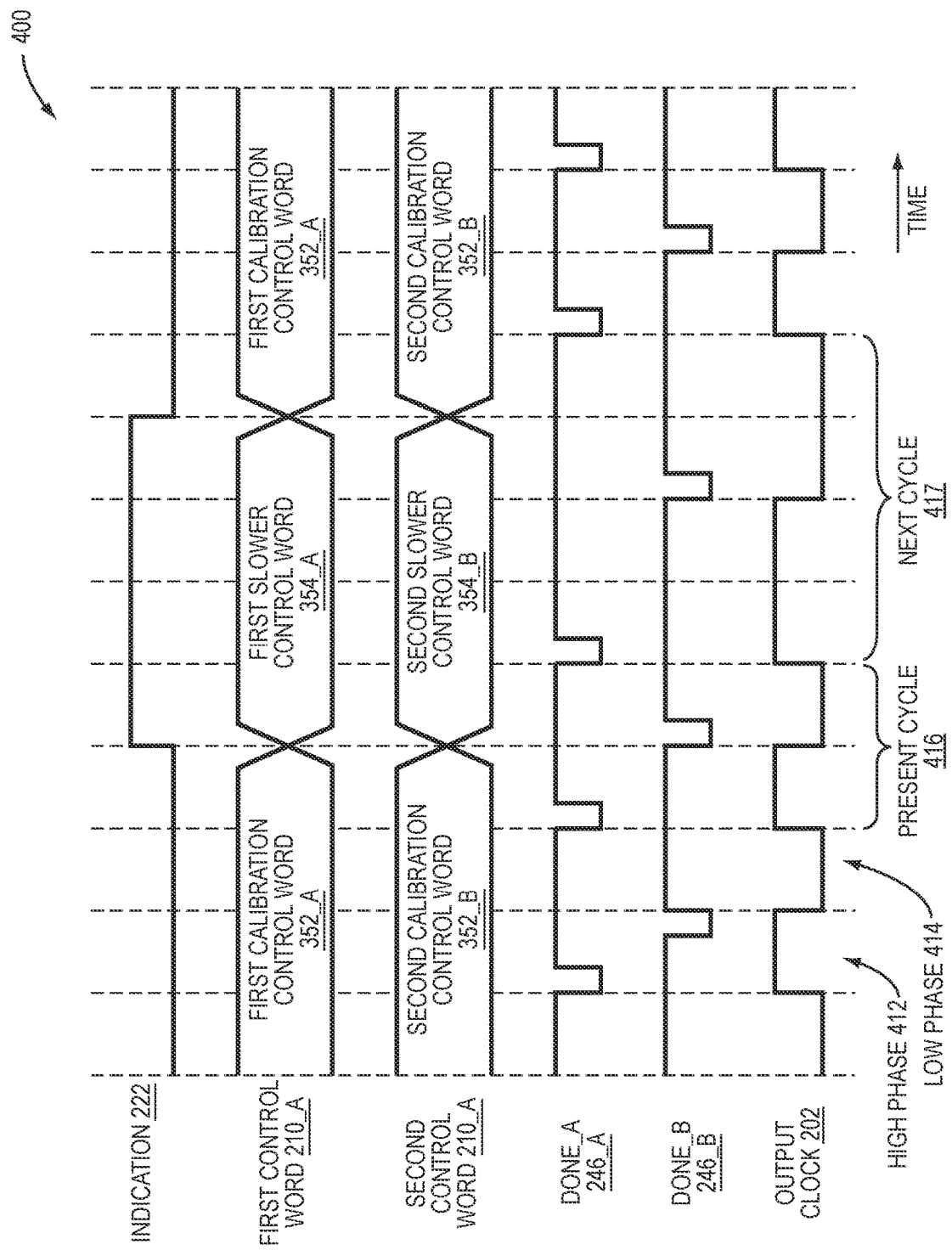
FIG. 4 is a timing diagram of an example embodiment of a set of signals in the circuit of FIG. 2.

FIG. 4 is a timing diagram 400 of an example embodiment of a set of signals in the circuit 200 of FIG. 2. With reference to FIGS. 2-4, the first control word 210_A and second control word 210_B are initially configured to be the first calibration control word 352_A and second calibration control word 352_B, respectively. As disclosed above, the first control word 210_A and second control word 210_B define respective first and second target numbers of inversions that are counted and the first done signal 246_A and second done signal 246_B may be asserted as active low signals in response reaching same. The output clock 202 has a high phase 412 and low phase 414 and transitions therebetween are triggered in response to such active low signals.

In the timing diagram 400, the indication 222 of expected usage of the at least one other circuit 230 is changed by the instruction decoder 237 in a present cycle 416 of the output clock 202 and the first control word 210_A and second control word 210_B are updated in the present cycle 416 by the ARO controller 220 in response to same. As shown in the timing diagram 400 of the example embodiment of FIG. 4, the first control word 210_A and second control word 210_B are updated to the first slower control word 354_A and second slower control word 354_B, respectively, causing a cycle time of the output clock 202 in the next cycle 417 to be longer relative to a cycle time of the output clock 202 in the present cycle 416. In the timing diagram 400, clock skew and transition delays are not shown.

As such, in the present cycle 416 of the output clock 202, the ARO controller 220 effects a change to the high phase 412 and the low phase 414 in the next cycle 417 of the output clock 202 by updating the first control word 210_A and second control word 210_B based on the indication 222 of expected usage of the at least one other circuit 230 in the next cycle 417. It should be understood that the timing of signals and configurations for the first control word 210_A and second control word 210_B as shown in the timing diagram 400 are for illustrative purpose and that the signals and control words of the circuit 200 are not limited thereto.

Referring back to FIG. 2, the circuit 200 may be integrated together with the at least one other circuit 230 in an integrated circuit (IC) macro of an IC chip, as disclosed above, and, thus, share a common supply voltage. According to an example embodiment, the at least one other circuit 230 may be a central processing unit (CPU). To minimize power consumption, voltage scaling may be employed to run the CPU at a lowest possible supply voltage for a given frequency. The lowest possible supply voltage is the lowest supply voltage at which the CPU can operate without failure at the given frequency. Such voltage scaling may be implemented, for example, using a low-dropout (LDO) linear regulator with dynamic voltage scaling (DVS) to supply the voltage; however, such voltage scaling is not limited to being implemented by same. According to an example embodiment disclosed herein, the ARO 204 may employ ring oscillators with different voltage scaling characteristics to advantageously minimize power, as disclosed below.

Figure 5A:
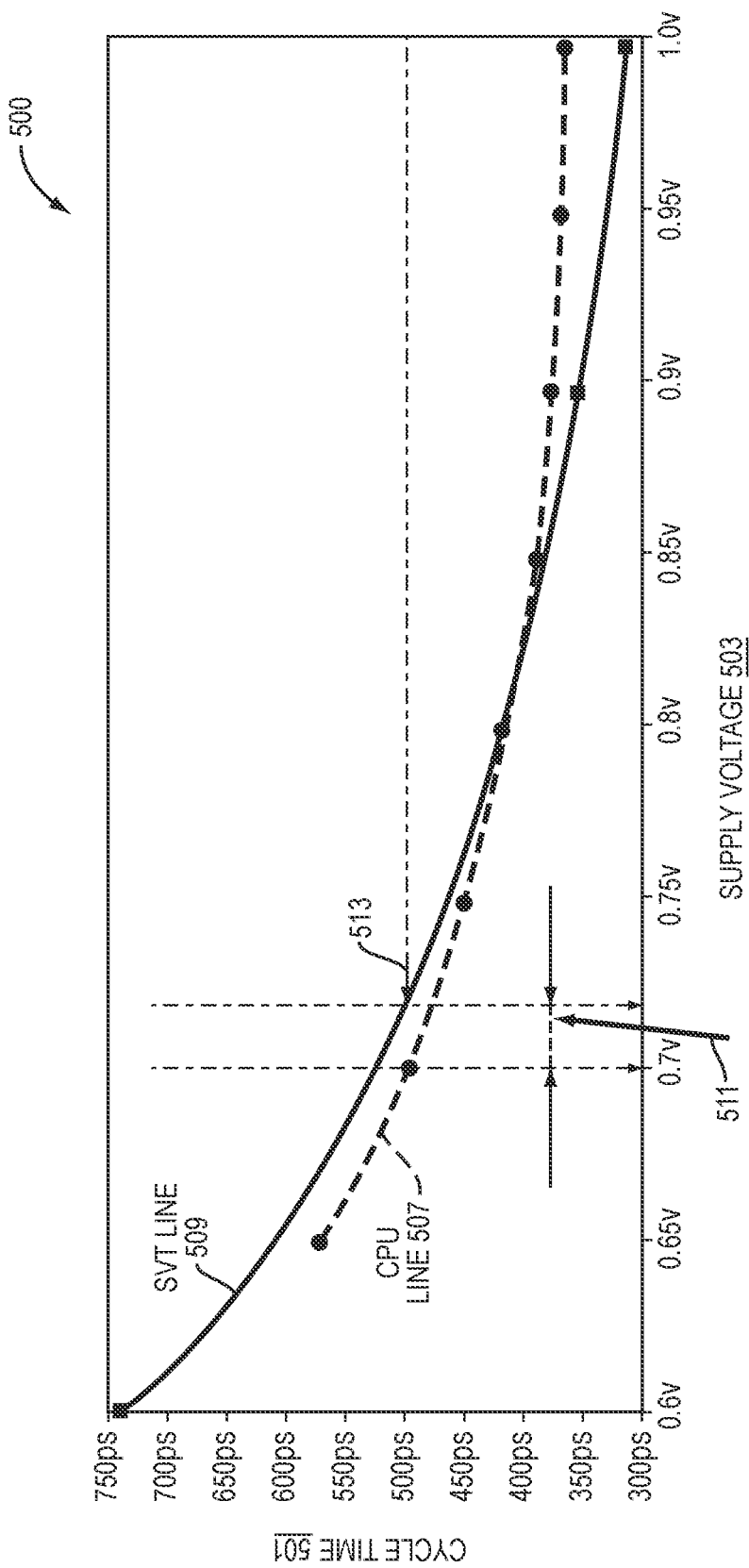
FIG. 5A is a graph of an example embodiment of voltage scaling.

FIG. 5A is a graph 500 of an example embodiment of voltage scaling. The graph 500 has an x-axis and y-axis representing the supply voltage 503 of a CPU (not shown) and cycle time 501 of a CPU clock (not shown) that drives the CPU, respectively. In the graph 500, a CPU line 507 plots a lowest possible supply voltage of the supply voltage 503 that can be employed without failure of the CPU for a given cycle time of the cycle time 501 of the CPU clock. In the example embodiment, scaling of the supply voltage 503 of the CPU at high voltage is dominated by critical resistor-capacitor (RC) paths.

According to an example embodiment, the CPU clock may be sourced using a ring oscillator (RO) that employs standard-Vt (SVT) cells. Such an RO may be referred to interchangeably herein as an SVT RO. The SVT RO may employ a same voltage supply as the CPU. As the voltage supply is increased, the clock sourced by the SVT RO that employs a given specified number of inversions increases in frequency, that is, its cycle time decreases as the supply voltage 503 increases. In the graph 500 of FIG. 5A, the SVT line 509 plots the cycle time 501 for such an SVT RO with respect to the supply voltage 503.

As shown in the graph 500, the SVT line 509 drops below the CPU line 507 when the supply voltage 503 is above 0.8 v and, thus, the supply voltage 503 would be limited to a region that is below 0.8 v to prevent the SVT RO from generating the CPU clock with a cycle time that would cause the CPU to fail. Use of such an SVT RO can, however, result in wasted power based on a voltage difference (e.g., margin) between the SVT line 509 and the CPU line 507. For example, in the example embodiment of FIG. 5A, at the coordinate 513 of the SVT line 509, the SVT line 509 indicates that 0.72 v is required by the SVT RO to produce the CPU clock with 500 ps cycle time.

The CPU line 507 reflects, however, that the supply voltage 503 of the CPU can be dropped down to 0.7 v for 500 ps of cycle time without failure of the CPU. Such a voltage difference, that is, the margin 511, is 20 mV for 500 ps of cycle time and translates into wasted power, such as 6% of wasted power in the example embodiment. An example embodiment disclosed herein may employ ring oscillators with differing voltage scaling characteristics to advantageously balance such wasted supply voltage and to maximize a region of the supply voltage 503 over which voltage scaling of the supply voltage or the CPU may be employed. According to an example embodiment, an ARO, such as the ARO 204 of FIG. 2, disclosed above, may employ ring oscillators (ROs) with differing voltage scaling characteristics, such as disclosed below with regard to FIG. 5B.

Figure 5B:
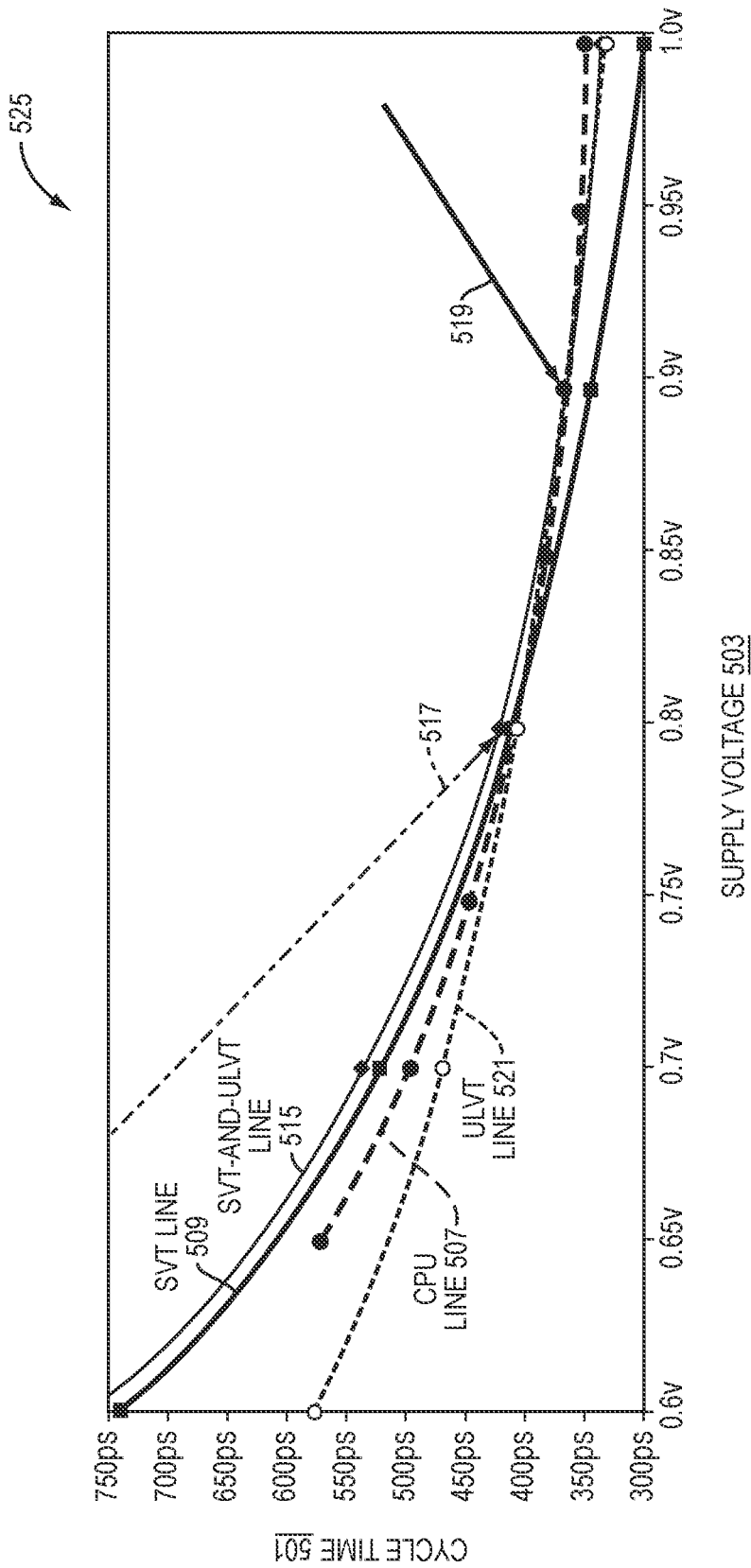
FIG. 5B is a graph of another example embodiment of voltage scaling.

FIG. 5B is a graph 525 of another example embodiment of voltage scaling. The graph 525 includes the CPU line 507 and SVT line 509 from the graph 500 of FIG. 5B, disclosed above. The graph 525 further includes an ultra-low-Vt (ULVT) line 521 and SVT-AND-ULVT line 515. The ultra-low-Vt line 521 indicates the voltage scaling characteristics for an RO that employs ULVT cells. According to an example embodiment, the ARO 204 of FIG. 2 may employ a first instance of ROs with SVT cells and a second instance of ROs with ULVT cells. The SVT-AND-ULVT line 515 represents the cycle time 501 with respect to the supply voltage 503 that is sourced based on employing such multiple instances of ROS with differing voltage scaling characteristics. An example embodiment of the ARO 204 of FIG. 2 that employs multiple instances of ROs with differing voltage scaling characteristics is disclosed further below with regard to FIG. 5C.

Referring back to the graph 525 of FIG. 5B, the SVT line 509 and ULVT line 521 have differing slopes. In the example embodiment of FIG. 5B, the ULVT line 521 has a shallower curve relative to the SVT line 509 below a 0.8 v supply voltage cross-over point 517 at which the SVT line 509 and ULVT line 521 cross-over. According to an example embodiment, the ARO 204 of FIG. 2, disclosed above, may employ a first instance of the first RO 208_A and second RO 208_B with SVT cells and a second instance of the first RO 208_A and second RO 208_B with ULVT cells.

Such multiple instances may be calibrated, as disclosed further below, such that the ROs have a same delay at the cross-over point 517, that is, at 0.8 v in the example embodiment. The cross-over point may be configured via different settings for the control words to the SVT-based ROs and ULVT-based ROs. The SVT-based ROs may be tuned, for example, to have a fewer number of inversions relative to the ULVT set of ROs to be of a same cycle time duration at the 0.8 v cross-over point 517. Such differing number of inversions may be controlled via the differing control word settings. It should be understood that the cross-over point 517 is not limited to 0.8 v and may be any desired crossover voltage supply level.

On a per-phase-basis, the phase of the output clock 202 may be aligned to the slower of the SVT or ULVT RO. As disclosed in the graph 500, the ULVT line 521 indicates that the ULVT-based RO is slower above 0.8 v cross-over point 517 relative to the SVT RO associated with the SVT line 509. As disclosed in the graph 525, the ULVT line 521 does not drop below the CPU line 507 until 0.9V.

As such, the ARO 204 of FIG. 2 may advantageously employ the ULVT-based ROs in an event the supply voltage 503 goes above the cross-over point 517 such that the supply voltage region for voltage scaling of the CPU may be extended to 0.9 v relative to 0.8 v if the SVT-based set of ROs alone were employed. Further, below the cross-over point 517, the SVT-based ROs may be employed by the ARO 204 to minimize the voltage margin relative to the CPU line 507 below the cross-over point 517. The SVT-AND-ULVT line 515 represents the voltage scaling that may be achieved by an ARO that includes two sets of voltage threshold types of ring oscillators, such as disclosed below with regard to FIG. 5C. Such an ARO may be employed as the ARO 204 of FIG. 2, disclosed above, to produce the output clock 202 that may be employed as the CPU clock to the at least one circuit 230 that may be a CPU with the voltage scaling characteristics represented by the CPU line 507 of the graph 500 and 525 of FIG. 5A and FIG. 5B, respectively. It should be understood, however, that cycle times and supply voltage settings of the graph 500 and graph 525 are for illustrative purpose and that embodiments disclosed herein are not limited thereto. Further, it should be understood that the two sets of voltage threshold types of ring oscillators are limited to SVT and ULVT voltage threshold types, as disclosed below with regard to FIG. 5C.

Figure 5C:
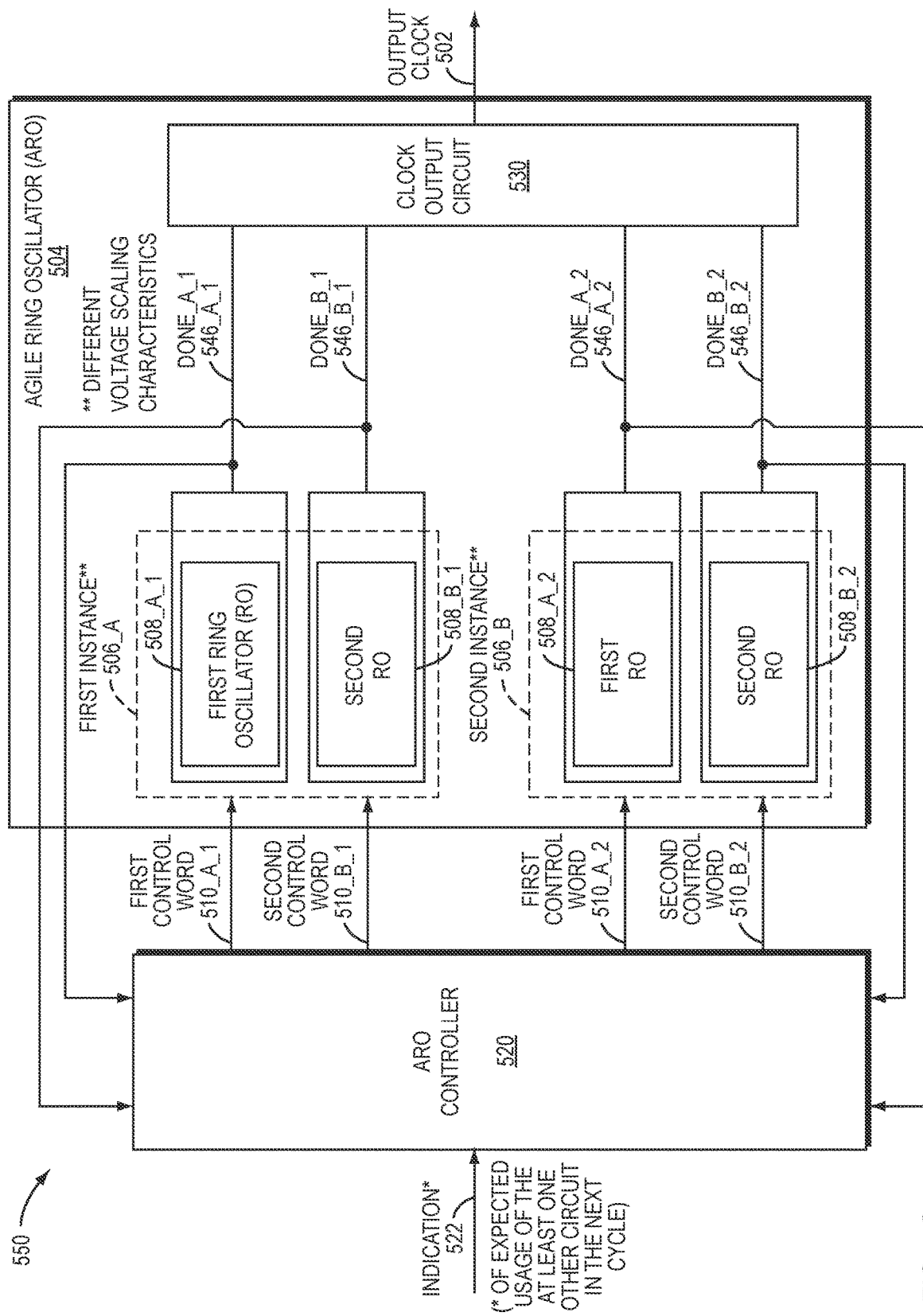
FIG. 5C is a block diagram of another example embodiment of a circuit for controlling cycle time of an output clock.

FIG. 5C is a block diagram of another example embodiment of a circuit 550 for controlling cycle time of an output clock 502. The circuit 550 comprises an agile ring oscillator (ARO) 504 that includes at least one instance of a first ring oscillator (RO) and a second RO. In the example embodiment, the at least one instance includes a first instance 506_A and a second instance 506_B. The first instance 506_A and second instance 506_B have different voltage scaling characteristics. For example, the first instance may be implemented using low-voltage-threshold (LVT) and standard-voltage-threshold (SVT) cells, respectively, SVT and LVT cells, respectively, LVT and ultra-low-voltage-threshold (ULVT) cells, respectively, ULVT and LVT cells, respectively, or implemented using any other combination of types of cells such that the first and second instances have different voltage scaling characteristics.

The first instance 506_A includes the first RO 508_A_1 and the second RO 508_B_1. The second instance 506_B includes the first RO 508_A_2 and the second RO 508_B_2. The first RO 508_A_1 and first RO 508_A_2 are configured to generate respective high phases of cycles of the output clock 502. The second RO 508_B_1 and second RO 508_B_2 are configured to generate respective low phases of cycles of the output clock 502. The output clock 502 is used to clock at least one other circuit (not shown). The at least one other circuit has a single clock domain that is asynchronous relative to its surroundings, as the ARO 504, providing the output clock 502, does not phase lock.

The circuit 550 further comprises an ARO controller 520 configured to control durations of the high and low phases of the output clock 502, independently. In the example embodiment, the ARO controller 520 is configured to update a pair of control words per instance as each instance includes a pair of ring oscillators.

For example, the ARO controller 520 is configured to update the first control word 510_A_1 and second control word 510_B_1 that control the high and low phases, respectively, that are generated using the first RO 508_A_1 and second RO 508_B_1 of the first instance 506_A. The ARO controller 520 is further configured to update the first control word 510_A_2 and second control word 510_B_2 that control the high and low phases, respectively, that are generated using the first RO 508_A_2 and second RO 508_B_2 of the second instance 506_B. Each ring oscillator of each instance is paired with a respective counter, as disclosed above with regard to FIG. 2, and each respective counter generates a done signal based on having counted a respective target number of inversions defined by a respective control word.

For example, the first RO 508_A_1 of the first instance 506_A is paired with a respective counter (not shown) that generates the respective first done signal 546_A_1 (i.e., DONE_A_1) based on having counted a respective target number of inversions propagated in the first RO 508_A_1 of the first instance 506_A, such respective target number defined by the first control word 510_A_1. Similarly, the second RO 508_B_1 of the first instance 506_A is paired with a respective counter (not shown) that generates the respective second done signal 546_B_1 (i.e., DONE_B_1) based on having counted a respective target number of inversions propagated in the second RO 508_B_1 of the first instance 506_A, such respective target number defined by the second control word 510_B_1.

Likewise, the first RO 508_A_2 of the second instance 506_B is paired with a respective counter (not shown) that generates the respective first done signal 546_A_2 (i.e., DONE_A_2) based on having counted a respective target number of inversions propagated in the first RO 508_A_2 of the second instance 506_B, such respective target number defined by the first control word 510_A_2. Similarly, the second RO 508_B_2 of the second instance 506_B is paired with a respective counter (not shown) that generates the respective second done signal 546_B_2 (i.e., DONE_B_2) based on having counted a respective target number of inversions propagated in the second RO 508_B_2 of the second instance 506_B, such respective target number defined by the second control word 510_B_2.

In a present cycle of the output clock 502, the ARO controller 520 is configured to effect a change to the high phase, low phase, or a combination thereof, of the output clock 502 in a next cycle of the output clock 502 by updating the first control word 510_A_1 to the first instance 506_A, second control word 510_B_1 to the first instance 506_A, first control word 510_A_2 to the second instance 506_B, second control word 510_B_2 to the second instance 506_B, or a combination thereof, based on the indication 522 of expected usage of the at least one other circuit in the next cycle.

According to an example embodiment, the ARO controller 520 maintains a first instance of the control words 310 and calibration counter 370 for use in updating the control words to the first instance 506_A based on the indication 522 and maintains a second instance of the control words 310 and calibration counter 370 for use in updating the control words to the second instance 506_B based on the indication 522.

According to an example embodiment, the ARO 504 includes a clock output circuit 530 that outputs the output clock 502 and logic (not shown) therein may be configured to cause the output clock 502 to transition to the high phase based on a slower of the first done signal 546_A_1 generated based on the first instance 506_A and the first done signal 546_A_2 generated based on the second instance 506_B. Similarly, such logic may be configured to cause the output clock 502 to transition to the low phase based on a slower of the second done signal 546_B_1 generated based on the first instance 506_A and the second done signal 546_B_2 generated based on the second instance 506_B.

Such a change effected in the next cycle improves a performance-to-power ratio of the at least one other circuit, relative to not effecting the change, by altering a period (i.e., cycle time) of the output clock 502, temporarily.

Figure 5D:
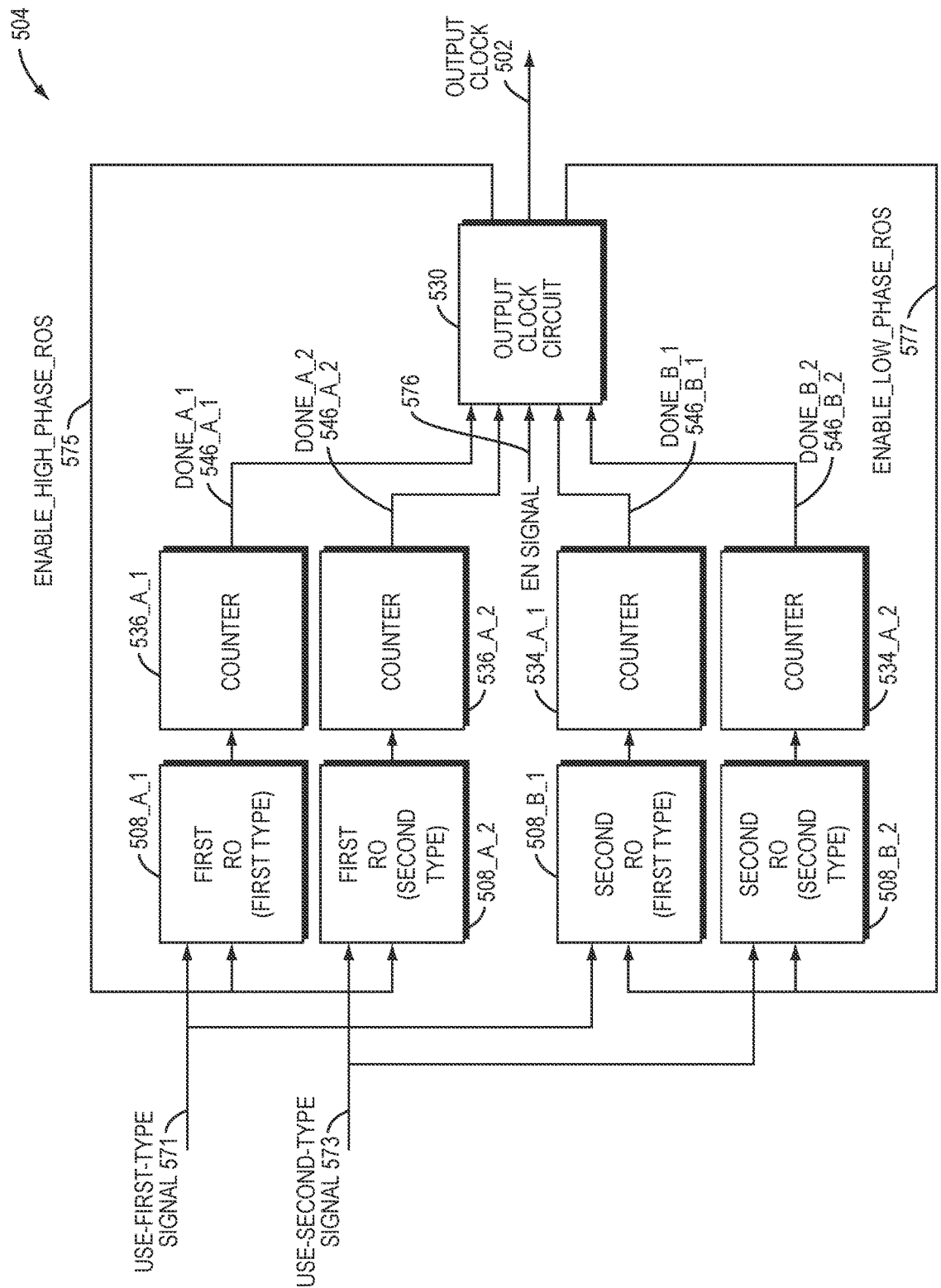
FIG. 5D is a block diagram of an example embodiment of the ARO of FIG. 5C.

FIG. 5D is a block diagram of an example embodiment of the ARO 504 of FIG. 5C, disclosed above. For simplicity, in the example embodiment of FIG. 5D, the ARO controller 520 is not shown and signaling between the ARO controller 520 and the ARO 504, as disclosed in FIG. 5C, is not shown. Referring to FIG. 5D, the ARO 504 includes two sets of dual ring oscillators (ROs), wherein voltage scaling characteristics of the two sets differ.

For example, a first set of the dual ROs may be implemented using SVT type cells while a second set of the dual ROs may be implemented using ULVT type cells. Alternatively, the first set of dual ROs may be implemented using LVT type cells whereas the second set of dual ROs may be implemented using ULVT type cells. It should be understood, however that the first and second types of voltage scaling characteristics of the dual ROs is not limited to the SVT, ULVT, LVT, or any combination thereof disclosed herein, so long as the first and second sets of dual ROs are implemented with different types of voltage scaling characteristics. The first and second voltage types of voltage scaling characteristics may be advantageously chosen based on voltage scaling curves associated therewith relative to a voltage scaling curve of the at least one other circuit being driven by the output clock 502, such as disclosed above with regard to FIG. 5B.

Within each set of dual ROs, a first RO 508_A_1 of the first type of voltage scaling characteristic is employed for controlling a high phase of the output clock 502 and a second RO 508_B_1 of the first type of voltage scaling characteristic is employed for controlling a low phase of the output clock 502. Similarly, a first RO 508_A_2 of a second type of voltage scaling characteristic is employed for controlling a high phase of the output clock 502 and a second RO 508_B_2 of the second type of voltage scaling characteristic is employed for controlling a low phase of the output clock 502. While the ARO 504 may include the two sets of ROs, one or both of the sets of dual ROs may be enabled for use based on control signals received by the ARO 504 from the ARO controller 520.

For example, with reference to FIG. 5C and FIG. 5D, the ARO controller 520 may control a use-first-type signal 571. If asserted, the use-first-type signal 571 enables the first RO 508_A_1 of the first type of voltage scaling characteristic to be employed for controlling the high phase of the output clock 502 and enables the second RO 508_B_1 of the first type of voltage scaling characteristic to be employed for controlling the low phase of the output clock 502.

Similarly, the ARO controller 520 may control a use-second-type signal 573 input to the ARO 504. If asserted, the use-second-type signal 573 enables the first RO 508_A_2 of the second type of voltage scaling characteristic to be employed for controlling the high phase of the output clock 502 and enables the second RO 508_B_2 of the second type of voltage scaling characteristic to be employed for controlling the low phase of the output clock 502.

As such, the ARO controller 520 may control, via the use-first-type signal 571 and the use-second-type-signal 573 whether the ARO 504 employs the first set of dual ROs of the first type, second set of dual ROs of the second type, or both the first and second sets of dual ROs for producing the output clock 502. Each ring oscillator of each set of dual ROs is paired with a respective counter, as disclosed above with regard to FIG. 2. For example, in the example embodiment of FIG. 5D, the first RO 508_A_1, first RO 508_A_2, second RO 508_B_1, and second RO 508_B_2, are paired with the counter 536_A_1, counter 536_A_2, counter 534_A_1, and counter 534_A_2, respectively, and each respective counter generates a done signal based on having counted a respective target number of inversions defined by a respective control word input to the ARO 504 from the ARO controller 520.

In an event the use-first-type-signal 571 is de-asserted, that is, the first RO 508_A_1 and second RO 508_B_1 of the first type of voltage scaling characteristics are not to be employed, respective counters paired thereto drive their respective done signals, namely, DONE_A_1 546_A_1 and DONE_B_1 546_B_1 to be asserted, such that those done signals have no impact on the output clock 502. Similarly, in an event the use-second-type-signal 573 is de-asserted, that is, the first RO 508_A_2 and second RO 508_B_2 of the second type of voltage scaling characteristics are not to be employed, respective counters paired thereto drive their respective done signals, namely, DONE_A_2 546_A_2 and DONE_B_2 546_B_2 to be asserted, such that those done signals have no impact on the output clock 502.

If, however, both sets of dual ROs are enabled, that is, the ARO controller 520 has asserted both the use-first-type signal 571 and the use-second-type-signal 573, then the first RO 508_A_1 and first RO 508_A_2 are configured to generate respective high phases of cycles of the output clock 502. Similarly, the second RO 508_B_1 and second RO 508_B_2 are configured to generate respective low phases of cycles of the output clock 502. On a phase-by-phase basis, the output clock circuit 530 is configured to select a given phase generated by the slower ring oscillator, of the two types of ROs generating the given phase, as a respective phase for the output clock 502.

For example, if a high phase generated by the first RO 508_A_1 of the first type of voltage scaling characteristic is longer than the high phase generated by the first RO 508_A_2 of the second type of voltage scaling characteristic, then the output clock circuit 530 is configured to align the high phase of the output clock 502 with output clock phase aligned to the first RO 508_A_1, while otherwise it is aligned to the high phase generated by first RO 508_A_2. Such selection, or phase alignment, is done on a phase-by-phase basis of the output clock 502. Following such phase selection/alignment, the output clock circuit 530 may deassert the enable signal for the appropriate RO/counter pair by deasserting the enable_high_phase_ROs signal 575 or deasserting the enable_low_phase_ROs signal 577. For example, following such high phase selection/alignment, the output clock circuit 530 may deassert the enable_high_phase_ROs signal 575 and assert the enable_low_phase_ROs signal 577.

For example, if a low phase generated by the second RO 508_B_1 of the first type of voltage scaling characteristic is longer than the low phase generated by the second RO 508_B_2 of the second type of voltage scaling characteristic, then the output clock circuit 530 is configured to align the low phase of the output clock 502 with output clock phase aligned to the first RO 508_A_2, while otherwise it is aligned to the low phase generated by second RO 508_B_2. Such phase selection, or alignment, is performed by the output clock circuit 530 based on respective done signals from the respective counters associated with the respective ROs, as disclosed above with regard to FIG. 2. With reference to FIG. 5D, the output clock circuit 530 may be enabled or disabled via an EN signal 576 that may be used to enable or disable the output clock 502 during, for example, an initialization phase of the ARO 504. Such an initialization phase may be employed, for example, following a reset of the ARO 504. With reference to FIG. 5C and FIG. 5D, the ARO controller 520 controls respective durations of the high and low phases of the output clock 502 via control words input to the ARO 504. Such control words may be calibrated for both types of dual ROs employed by the ARO 504 using "shadow" AROs, also referred to interchangeably herein as "calibration" AROs, as disclosed below.

According to an example embodiment, the ARO 504 that produces the output clock 502 used to source the at least one other circuit that may be, for example, a CPU, may be referred to as a "functional" ARO or "true" ARO. As disclosed above with regard to FIG. 5C and FIG. 5D, the functional ARO may employ two sets of dual ring oscillators (ROs), wherein voltage scaling characteristics of the two sets differ. Such sets of dual ROs may have separate calibration control, such as disclosed further below.

As disclosed above, an ARO clock, such as the output clock 202 of FIG. 2 or output clock 502 of FIGS. 5C and 5D, disclosed above, can replace a PLL clock. The ARO clock is based on a ring oscillator and its frequency inherently adjusts to the PVT conditions. According to an example embodiment, the ARO controller, such as the ARO controller 220 of FIG. 2 or the ARO controller 520 of FIGS. 5C and 5D, has a calibration mode. In the calibration mode, a user may configure a frequency target and the ARO clock dynamically adjusts as close as possible to the frequency target. The ARO controller may also support a manual mode (user mode). In the manual mode, the user manually configures its controls.

In the calibration mode, a reference clock is used as a reference. The reference clock may be generated by any suitable clock generator, such as a crystal oscillator. The ARO controller employs the reference clock to trigger a reference clock counter. The reference clock counter may be initialized by the ARO controller to a reference clock value, such as ref_cnt_init_val[9:0]. It should be understood, however, that the reference clock value is not limited to a ten-bit value. In addition, the ARO controller may initialize a CPU clock counter to a CPU clock value, such as cpu_cnt_init_val[13:0]. It should be understood, however, that the reference clock value is not limited to a fourteen-bit value. According to an example embodiment, both the reference and CPU clock counters are down counters. It should be understood, however, that the reference and CPU clock counters may be up counters, down counters, or a combination thereof. The CPU clock counter is triggered by the output clock 502. The CPU clock counter and associated initialization value may be referred to herein as calibration counters as such counters may be triggered by the output clock 502 that may or may not be driving a CPU.

If implemented as down counters, when the reference clock counter reaches zero, the ARO controller may stop the CPU clock counter and check whether the CPU clock counter has reached zero. In an event the CPU clock counter has reached zero, then the CPU clock is faster or equal to the CPU target frequency and a frequency of the ARO clock is reduced. Otherwise, the frequency of the ARO clock is increased. As a result, the ARO clock frequency toggles around the target frequency. The time for the reference clock counter to reach zero may be called the "calibration window." At the end of each calibration window, the frequency of the ARO clock may be adjusted (up or down).

Such frequency adjustment may be performed by the ARO controller via addition or subtraction of an inverter delay to a ring oscillator loop of the ARO. The addition or subtraction is made via a change to the control word sent to the ARO. According to an example embodiment, the frequency of the ARO clock may be configured in calibration mode by the ARO controller. The reference clock value and CPU clock value of the reference clock counter and CPU clock counter, respectively, may be set by the ARO controller according to: cpu_cnt_init_val=ref_cnt_init_val*(cpu_target_freq/ref_clk_freq), wherein cpu_target_freq is the target CPU frequency, ref_clk_freq is the reference clock frequency, ref_cnt_init_val is an initial value for the reference clock counter, and cpu_cnt_init_val is an initial value for the CPU clock counter.

According to an example embodiment, the ref_cnt_init_val may be configured to be a value that is equal to the reference clock frequency in MHz, such as 100 for 100 MHz. It should be understood that the reference clock frequency is not limited to 100 MHZ. In this case, the formula is simplified, namely: cpu_cnt_init_val=cpu_target_freq (in MHz). The following is an example with example values for illustrative purpose and it should be understood that example embodiments disclosed herein are not limited to the example reference clock and CPU target frequency values disclosed herein. In an example use case, the ref_clk_freq is 100 MHz and the ref_cnt_init_val is set to 100 (decimal). To get a CPU target frequency of 1000 MHz, the ARO controller should set the cpu_cnt_init_val to 1000 (decimal).

If, however, the reference clock frequency is not an integer value, then the first integer that is a multiple of the reference clock frequency may be employed. For example, given that the reference clock frequency is 156.25 MHz, the integer value 625 (which is 4*156.25) may be taken. Based on a target frequency of 1000 MHz, and according to: cpu_cnt_init_val=(cpu_target_freq/ref_clk_freq)*ref_cnt_init_val, the cpu_cnt_init_val=(1000/156.25)*625=4000 (decimal).

When the ARO has reached the target frequency in calibration mode, a calibration lock signal may be asserted, namely, a calib_lock_status signal may be asserted by the ARO controller. The indication of calibration lock may be asserted when the ARO controller has determined that the ARO frequency is alternating in the up and down direction near the target frequency.

The ARO controller may be configured to determine a minimum ARO target configuration. During calibration mode, the ARO target configuration may be dynamically increased or decreased to keep the frequency as close as possible to the target frequency. When the at least one circuit driven by the output clock of the ARO uses DVS, the voltage supply might be scaled down, as disclosed above with regard to FIGS. 5A and 5B. For example, the at least one circuit may be a CPU and, in an event the CPU is using DVS, for example by an LDO mechanism, as disclosed above, the voltage might be scaled down, requiring the ARO calibration to compensate by decreasing the ARO cycle delay. According to an example embodiment, as a precaution, the calibration mechanism implemented by the ARO controller does not let the ARO configuration become less than a configured minimal value.

According to an example embodiment, a frequency of the ARO clock, such as the output clock 202 and output clock 502, disclosed above, may be changed in calibration mode. Changing the ARO frequency on the fly, that is, dynamically, during calibration mode can be done by simply programming a new value to the cpu_cnt_init_val disclosed above. Once the new value is programmed, the calibration mechanism of the ARO controller will change the ARO frequency, incrementally, by adding or deleting inversion delays, toward the new target frequency. It should be understood that ARO clock does not incur any glitches in response to same and can be employed functionally during the transition period toward the new target frequency. Further, since the cpu_cnt_init_val may not be synchronized, an incorrect value may be captured into the CPU counter for one calibration window which might lead to a single incorrect increment or decrement to an inversion delay, which is not an issue as it would be recovered in a next calibration window.

According to an example embodiment, a longer calibration window may provide better ARO response to voltage drops and the ARO controller may include a mechanism to factorize the duration of the calibration window. The factorization value of the calibration window may be determined via a reference clock count factor setting, referred to interchangeably herein as ref_cnt_fctr[3:0]. It should be understood that the reference clock count factor setting is not limited to four bits. Assuming, that R=ref_cnt_init_val and X=ref_cnt_fctr, the calibration window duration may be computed according to: duration=R*(2**X) reference clocks. For example, assuming R=100, the duration of the calibration window is:

X=4'd0→duration=100*(2**0)=100 ref clocks
X=4'd1→duration=100*(2**1)=200 ref clocks
X=4'd2→duration=100*(2**2)=400 ref clocks
. . .
. . .
X=4'd15→duration=100*(2**15)=3,276,800 ref clocks.

According to an example embodiment, the calibration lock time is based on a difference between a start frequency, that is, a present frequency of the ARO clock, and the target frequency for the ARO clock. A larger difference therebetween causes a longer calibration lock time. The calibration lock time is based on the duration of the calibration window. A longer calibration window causes a longer lock time. According to an example embodiment, the ARO controller may implement a calibration lock time optimizer.

To decrease the calibration lock time, the calibration lock time optimizer may be enabled. According to an example embodiment, in an event the calibration lock time optimizer is enabled, as long as the frequency of the output clock from the ARO, that is, the ARO frequency, is less than the target frequency for the output clock by more than a frequency guard band, a small calibration window (non-factorized) may be employed. Otherwise, there is no change to the presently programmed duration of the calibration window.

The frequency guard band may be configured via a programmable setting, for example by setting a value of ref_cnt_frq_grd[1:0]. It should be understood that the frequency guard band is not limited to two bits. According to an example embodiment, the frequency guard band may be selected from values of 128, 256, 384 or 512 MHz. It should be understood, however, that other values may be employed for the frequency guard band.

In calibration mode, the ARO controller works to configure the ARO such that the output clock produced therefrom is as close as possible to the target frequency as possible. The cycle time of the output clock is determined by the configured number of inverter delays in the ARO ring oscillator, as disclosed above. As such, the maximal resolution in changing the frequency is by adding or removing one inverter delay during each calibration window. A worst-case scenario of the cycle time changes would be:
Trgt_Cyc_Time
Trgt_Cyc_Time-Inv_Dly
Trgt_Cyc_Time
Trgt_Cyc_Time-Inv_Dly
. . .
. . .
→The average cycle time, in this example, is (Trgt_Cyc_Time-½ *Inv_Dly).

According to an example embodiment, in a user mode, the ARO may be controlled directly by a set of user configurations and there is no use of any internal automatic mechanism to control the ARO. The ARO may enter the calibration mode or user mode following release from reset. During reset, the ARO may be configured by the ARO controller to have a valid configuration (e.g., pre-characterized), that is, an initial configuration for generating the output clock with a target frequency. According to an example embodiment, the output clock from the ARO may be selected to source the at least one other clock circuit. For example, the ARO or another controller may control a clock selector that selects between the output clock from the ARO and another clock(s), such as a PLL clock. Switching a source clock between output clock from the ARO and another clock(s), such as a PLL clock, may be performed via a glitch-free mechanism as is known in the art.

Referring back to FIG. 5C and FIG. 5D, the ARO 504 is a functional ARO, wherein the output clock 502 to the at least one other circuit is sourced by the functional ARO 504. According to an example embodiment, the ARO 504 may be replicated as a first shadow ARO (not shown) and a second shadow ARO (not shown). The first instance that is associated with the first voltage scaling characteristic and replicated in the first shadow ARO may be disabled in the first shadow ARO and the second instance that is associated with the second voltage scaling characteristic and replicated in the second shadow ARO may be disabled in the second shadow ARO.

The ARO controller 520 may be further configured to employ the first shadow ARO to calibrate respective control words sent to the functional ARO controller 520 for controlling inversion delay in the first instance 506_A for achieving a target frequency and employ the second shadow ARO to calibrate respective control words sent to the functional ARO 504 for controlling inversion delay in the second instance 506_B for achieving the target frequency.

The ARO controller 520 may employ a first pair of counters, such as the reference and CPU clock counters disclosed above, and the first pair of counters may be associated with the first shadow ARO. Similarly, a second pair of counters may be associated with the second shadow ARO. The ARO controller 520 may be further configured to toggle between use of the first shadow ARO and the second shadow ARO on a calibration-window-by-calibration window basis.

As such, a functional ARO, such as the ARO 504 disclosed above, may be implemented as a dual SVT/ULVT system, or based on another combination of voltage scaling characteristics, and replicated by shadow AROs, wherein a first shadow ARO is employed for calibrating control words of the SVT section of the functional ARO 504 and a second shadow ARO is implemented for the calibrating control words of the ULVT section of the functional ARO 504. Alternatively, the ARO 504 may be calibrated without use of shadow AROs or counters associated therewith. For example, the ULVT section could be adjusted by adding or decrementing an inversion delay thereof and, in an event such change adjusts the frequency of the output clock 502 in a manner that is toward the target frequency, then ARO controller may continuity to employ the ULVT instance for generating the output clock 502.

According to an example embodiment, another counter may be employed that is triggered by the ARO clock and may be used to adjust the duration of the reference clock counter. According to another example embodiment, a single shadow ARO may be employed and use of the single shadow ARO may be toggled on a calibration-window-by-calibration-window basis. For example, in a first calibration window, the single shadow ARO may be employed to calibrate a first set of dual ROs implemented with a first voltage scaling characteristic, whereas in a second calibration window immediately following the first calibration window, a second set of dual ROs implemented with a second voltage scaling characteristic may be employed to calibrate a second set of dual ROs implemented with the second voltage scaling characteristic.

Figure 6:
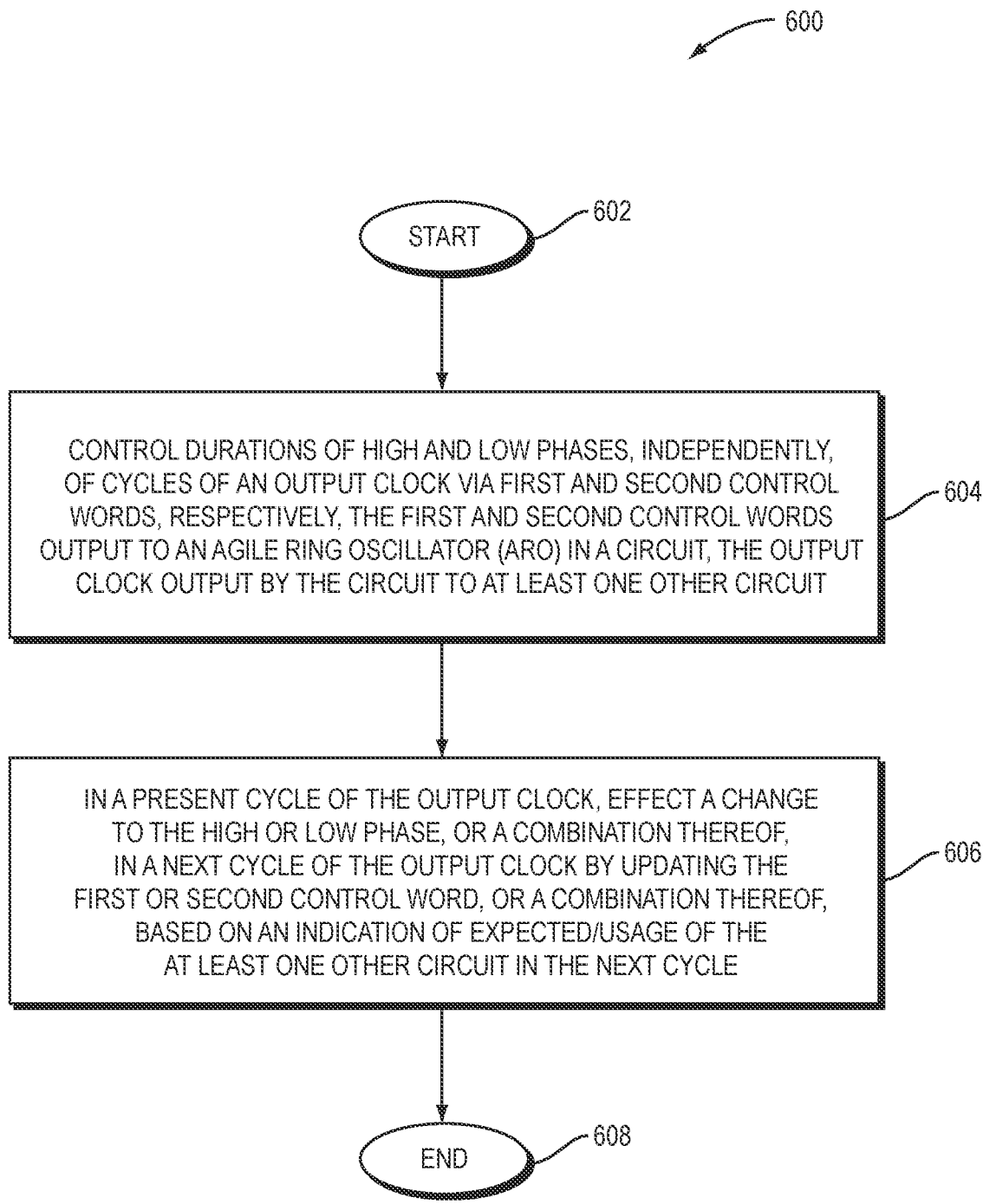
FIG. 6 is a flow diagram of an example embodiment of a method that controls cycle time of an output clock.

FIG. 6 is a flow diagram 600 of an example embodiment of a method that controls cycle time of an output clock. The method beings (602) and controls durations of high and low phases, independently, of cycles of the output clock via first and second control words, respectively, the first and second control words output to an agile ring oscillator (ARO) in a circuit, the output clock output by the ARO to at least one other circuit (604). The ARO includes at least one instance of a first ring oscillator (RO) and a second RO. The first and second ring oscillators are used for generating the high and low phases, respectively. In a present cycle of the output clock, the method effects a change to the high or low phase, or a combination thereof, in a next cycle of the output clock by updating the first or second control word, or a combination thereof, based on an indication of expected usage of the at least one other circuit in the next cycle (606). The method thereafter ends (608) in the example embodiment.

Effecting the change in the next cycle improves a performance-to-power ratio of the at least one other circuit, relative to not effecting the change, by altering a period of the output clock, temporarily. The period may be altered by changing a respective target count of signal inversions of a respective signal propagated in the first RO, second RO, or a combination thereof.

The method may further comprise generating the indication by an instruction decoder of a processor, wherein the indication represents expected activity or inactivity of the at least one circuit expected in the next cycle. The indication may be generated in the present cycle.

The method may further comprise identifying, by the instruction decoder, instructions to be executed by the at least one other circuit. The indication may represent whether the at least one other circuit will be executing at least one instruction in the next cycle. The output clock may be associated with a target frequency. In an event the indication indicates that the at least one other circuit is expected to be active in the next cycle, the change causes a frequency of the output clock to be lower or higher than the target frequency by altering a period of the output clock in the next cycle by changing a respective target count of signal inversions of a respective signal propagated in the first RO, second RO, or a combination thereof.

The method may further comprise maintaining first and second calibration control words for updating the first and second control words, respectively, to cause the output clock to be generated with a target frequency. The method may further comprise maintaining first and second slower control words for configuring the first and second control words, respectively, to cause the output clock to be generated with a slower frequency that is slower relative to the target frequency. The method may further comprise relaxing timing, in the next cycle, by updating, in the present cycle, the first and second control words to be the first and second slower control words, respectively, causing a cycle time of the output clock to increase in the next cycle.

In an event the indication changes state in the present cycle and the first and second control words are configured, in the present cycle, as the first and second calibration control words, respectively, the updating may include updating the first and second control words to be the first and second slower control words, respectively. In an event the indication changes state in the present cycle and the first and second control words are, presently, configured to be the first and second slower control words, respectively, the updating may include updating the first and second control words, in the present cycle, to the first and second calibration control words, respectively.

The method may further comprise adjusting the first and second calibration control words based on a calibration cycle and updating the first and second control words to the first and second calibration control words, respectively, in response to the adjusting and based on the indication.

The method may further comprise resetting and reloading a calibration counter with a target reference count at a start of a calibration cycle, setting the target reference count based on the target frequency and a time window between the start of the calibration cycle and an end of the calibration cycle, triggering the calibration counter via the output clock, and adjusting the first and second calibration control words based on a value of the calibration counter at the end of the calibration cycle.

The slower frequency may represent a slowest frequency for a given voltage below which the least one other circuit is unable to perform its intended function at the given voltage.

The method may further comprise using the first RO to reset and enable the second RO and using the second RO to reset and enable the first RO.

The method may further comprise counting, by a first counter, a first target number of inversions propagated along a first plurality of inverting gates, the first RO including the first plurality of inverting gates formed in a first ring. The method may further comprise selecting, by a first multiplexer coupled to the first RO, a given first inverting gate of the plurality of first inverting gates based on the first control word. The method may further comprise triggering the first counter via an output of the given first inverting gate, the first counter coupled to the first multiplexer. The method may further comprise counting, by a second counter, a second target number of inversions propagated along a second plurality of inverting gates, the second RO including the second plurality of inverting gates formed in a second ring. The method may further comprise selecting, by a second multiplexer coupled to the second RO, a given second inverting gate of the plurality of second inverting gates based on the second control word. The method may further comprise triggering the second counter via an output of the given second inverting gate, the second counter coupled to the multiplexer.

The method may further comprise generating a first done signal and a second done signal by the first and second counters, respectively, employing the first done signal to reset the second RO, reset the second counter, and re-load the second counter with the second target number, employing the second done signal to reset the first RO, reset the first counter, and re-load the first counter with the first target number, and setting the first and second target numbers based on a target frequency for the at least one other circuit. The method may further comprise generating the output clock based on the first and second done signals.

Figure 7:
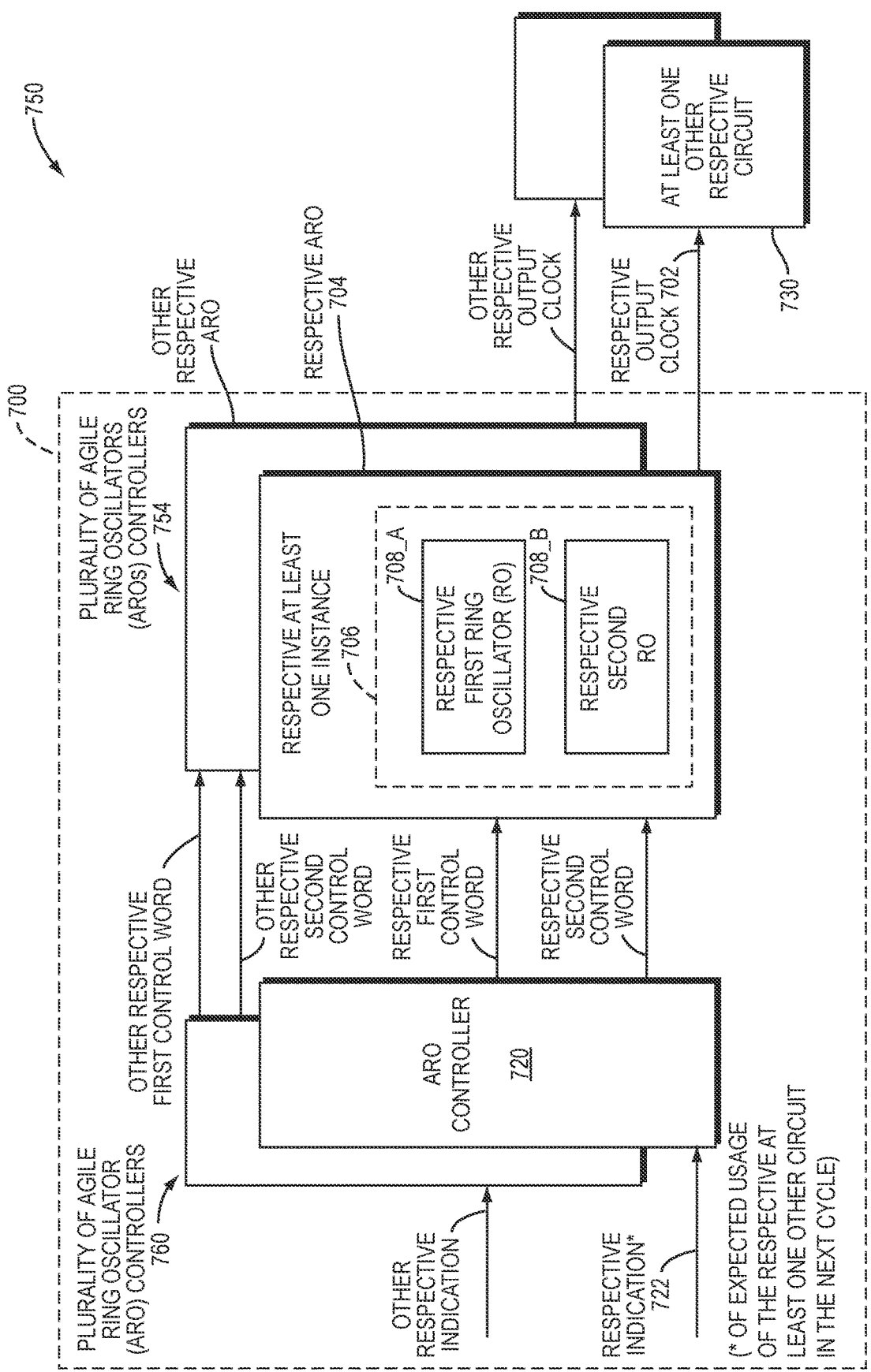
FIG. 7 is a block diagram of an example embodiment of a system for controlling cycle time of a plurality of output clocks.

FIG. 7 is a block diagram of an example embodiment of a system 750 for controlling respective cycle times of a plurality of output clocks. The system 750 comprises a circuit 700 that includes a plurality of agile ring oscillators (AROs) 754 each including at least one respective instance 706 of a first ring oscillator (RO) 708_A and a second RO 708_B. The first and second ring oscillators are configured to generate high and low phases, respectively, of cycles of a respective output clock 702 used to clock at least one other respective circuit 730. The circuit 700 includes a plurality of agile ring oscillator (ARO) controllers 760 each configured to (i) control durations of the high and low phases of a respective ARO 704 of the plurality of AROs 754, the durations controlled, independently, via first and second control words output to the respective ARO 704, respectively, and (ii) in a present cycle of the respective output clock 702, effect a change to the high or low phase, or a combination thereof, in a next cycle of the respective output clock 702 by updating the first or second control word, or a combination thereof, based on a respective indication of expected usage of the respective at least one other circuit in the next cycle. According to an example embodiment, the system 750 may be an integrated circuit (IC) chip.

Further example embodiments disclosed herein may be configured using a computer program product; for example, controls may be programmed in software for implementing example embodiments. Further example embodiments may include a non-transitory computer-readable medium containing instructions that may be executed by a processor, and, when loaded and executed, cause the processor to complete methods described herein. It should be understood that elements of the block and flow diagrams may be implemented in software or hardware, firmware, a combination thereof, or other similar implementation determined in the future. In addition, the elements of the block and flow diagrams described herein may be combined or divided in any manner in software, hardware, or firmware. If implemented in software, the software may be written in any language that can support the example embodiments disclosed herein. The software may be stored in any form of computer readable medium, such as random-access memory (RAM), read only memory (ROM), compact disk read-only memory (CD-ROM), and so forth. In operation, a general purpose or application-specific processor or processing core loads and executes software in a manner well understood in the art. It should be understood further that the block and flow diagrams may include more or fewer elements, be arranged or oriented differently, or be represented differently. It should be understood that implementation may dictate the block, flow, and/or network diagrams and the number of block and flow diagrams illustrating the execution of embodiments disclosed herein. Further, example embodiments and elements thereof may be combined in a manner not explicitly disclosed herein.

The teachings of all patents, published applications and references cited herein are incorporated by reference in their entirety.

While example embodiments have been particularly shown and described, it will be understood by those skilled in the art that various changes in form and details may be made therein without departing from the scope of the embodiments encompassed by the appended claims.

What is claimed is:

1. A circuit comprising:
    an agile ring oscillator (ARO) configured to generate high and low phases of cycles of an output clock; and
    an ARO controller configured to control durations of the high and low phases of the output clock, independently, via first and second outputs to the ARO, respectively.

2. The circuit of claim 1, wherein the ARO controller is further configured to:
    in a present cycle of the output clock, effect a change to the high or low phase, or a combination thereof, in a next cycle of the output clock by updating the first output or the second output, or a combination thereof, based on an indication of expected activity or inactivity of at least one other circuit expected in the next cycle.

3. The circuit of claim 2, wherein the circuit further includes an instruction decoder and wherein the instruction decoder is configured to identify instructions to be executed by at least one other circuit and wherein the indication represents whether the at least one other circuit will be executing at least one instruction in the next cycle.

4. The circuit of claim 1, wherein:
    the ARO includes a first ring oscillator (RO) and a second RO;
    the ARO controller is further configured to, in a present cycle of the output clock, effect a change to the high or low phase, or a combination thereof, in a next cycle of the output clock based on an indication of expected usage of at least one other circuit in the next cycle; and
    the output clock is associated with a target frequency, wherein, in an event the indication indicates that the at least one other circuit is expected to be active in the next cycle, the change causes a frequency of the output clock to be lower or higher than the target frequency by altering a period of the output clock in the next cycle by changing a respective target count of signal inversions of a respective signal propagated in the first RO, second RO, or a combination thereof.

5. The circuit of claim 1, wherein the ARO controller is further configured to:
    maintain first and second calibration controls for updating the first and second outputs, respectively, to cause the output clock to be generated with a target frequency; and
    maintain first and second slower controls for configuring the first and second outputs, respectively, to cause the output clock to be generated with a slower frequency that is slower relative to the target frequency.

6. The circuit of claim 5, wherein the ARO controller is further configured to relax timing, in a next cycle, by updating, in a present cycle, the first and second outputs to represent the first and second slower controls, respectively, causing a cycle time of the output clock to increase in the next cycle.

7. The circuit of claim 5, wherein, in an event an indication of expected usage of at least one other circuit in a next cycle changes state in a present cycle and the first and second outputs are configured, in the present cycle, to represent the first and second calibration controls, respectively, the ARO controller is further configured to update the first and second outputs to represent the first and second slower controls, respectively.

8. The circuit of claim 5, wherein, in an event an indication of expected usage of at least one other circuit in a next cycle changes state in a present cycle and the first and second outputs are, presently, configured to represent the first and second slower controls, respectively, the ARO controller is further configured to update the first and second outputs, in the present cycle, to represent the first and second calibration controls, respectively.

9. The circuit of claim 5, wherein, the ARO controller is further configured to:
    adjust the first and second calibration controls based on a calibration cycle; and
    update the first and second outputs to represent the first and second calibration controls, respectively, in response to such adjustment and based on an indication of expected usage of at least one other circuit.

10. The circuit of claim 9, wherein:
    the ARO controller includes a calibration counter;
    the ARO controller is further configured to reset and reload the calibration counter with a target reference count at a start of the calibration cycle;
    the target reference count is based on the target frequency and a time window between the start of the calibration cycle and an end of the calibration cycle;
    the calibration counter is configured to be triggered by the output clock; and
    the first and second calibration controls are adjusted based on a value of the calibration counter at the end of the calibration cycle.

11. The circuit of claim 5, wherein the slower frequency represents a slowest frequency for a voltage below which at least one other circuit is unable to perform its intended function at the voltage.

12. The circuit of claim 1, wherein the ARO includes a first RO and a second RO and wherein:
    the first RO is used to reset and enable the second RO;
    the second RO is used to reset and enable the first RO;

the first RO includes a first plurality of inverting gates formed in a first ring;
the first RO is coupled to a first multiplexer;
the first multiplexer is coupled to a first counter configured to generate a first done signal;
the first RO, first multiplexer, and first counter, in combination, are configured to count a first target number of inversions propagated along the first plurality of inverting gates, the first multiplexer configured to select a given first inverting gate of the plurality of first inverting gates based on a first control, the given first inverting gate selected to trigger the first counter;
the second RO includes a second plurality of inverting gates formed in a second ring;
the second RO is coupled to a second multiplexer;
the second multiplexer is coupled to a second counter configured to generate a second done signal;
the second RO, second multiplexer, and second counter are configured, in combination, to count a second target number of inversions propagated along the second plurality of inverting gates, the second multiplexer configured to select a given second inverting gate of the plurality of second inverting gates based on a second control, the second inverting gate selected to trigger the second counter.

13. The circuit of claim 12, wherein the circuit is configured to:
employ the first done signal to reset the second RO and cause the second counter to be reset and re-loaded with the second target number; and
employ the second done signal to reset the first RO and cause the first counter to be reset and re-loaded with the first target number, the first and second target numbers configured based on a target frequency for at least one other circuit.

14. The circuit of claim 12, further comprising a clock output circuit configured to output the output clock based on the first and second done signals.

15. The circuit of claim 1, wherein the output clock is used to clock at least one other circuit and wherein the at least one other circuit has a single clock domain.

16. The circuit of claim 1, wherein the ARO includes a first RO and a second RO, wherein the first RO and second RO are a first instance of the first RO and second RO and, wherein the circuit further comprises a second instance of the first RO and second RO, and wherein the first and second instances have different voltage scaling characteristics.

17. The circuit of claim 16, wherein the output clock is output to at least one other circuit and sourced by the ARO, wherein the first instance is associated with a first voltage scaling characteristic, wherein the second instance is associated with a second voltage scaling characteristic, and wherein the circuit further includes:
a first shadow ARO, the first shadow ARO replicating the ARO; and
a second shadow ARO, the second shadow ARO replicating the ARO,
wherein the first instance that is associated with the first voltage scaling characteristic and replicated in the first shadow ARO is disabled in the first shadow ARO, and wherein the second instance that is associated with the second voltage scaling characteristic and replicated in the second shadow ARO is disabled in the second shadow ARO.

18. The circuit of claim 17, wherein the ARO controller is further configured to:
employ the first shadow ARO to calibrate respective controls sent to the ARO for controlling inversion delay in the first instance for achieving a target frequency;
employ the second shadow ARO to calibrate respective controls sent to the ARO for controlling inversion delay in the second instance for achieving the target frequency;
employ a first pair of counters associated with the first shadow ARO and to employ a second pair of counters associated with the second shadow ARO; and
toggle between use of the first shadow ARO and the second shadow ARO on a calibration-window-by-calibration window basis.

19. A method comprising:
generating high and low phases, respectively, of cycles of an output clock from a circuit, the generating employing an agile ring oscillator (ARO);
controlling durations of the high and low phases of the output clock, independently, via first and second outputs to the ARO, respectively; and
outputting the output clock generated.

20. The method of claim 19, further comprising:
in a present cycle of the output clock, effecting a change to the high or low phase, or a combination thereof, in a next cycle of the output clock by updating the first output or the second output, or a combination thereof, based on an indication of expected activity or inactivity of at least one other circuit expected in the next cycle.

21. The method of claim 19, wherein the ARO includes a first ring oscillator (RO) and a second RO, and wherein the method further comprises:
in a present cycle of the output clock, effecting a change to the high or low phase, or a combination thereof, in a next cycle of the output clock, based on an indication of expected usage of at least one other circuit in the next cycle, wherein the output clock is associated with a target frequency,
wherein, in an event the indication indicates that the at least one other circuit is expected to be active in the next cycle, the change causes a frequency of the output clock to be lower or higher than the target frequency by altering a period of the output clock in the next cycle by changing a respective target count of signal inversions of a respective signal propagated in the first RO, second RO, or a combination thereof.

22. The method of claim 19, further comprising:
maintaining first and second calibration controls for updating the first and second outputs, respectively, to cause the output clock to be generated with a target frequency; and
maintaining first and second slower controls for configuring the first and second outputs, respectively, to cause the output clock to be generated with a slower frequency that is slower relative to the target frequency.

23. The method of claim 22, further comprising relaxing timing, in a next cycle, by updating, in a present cycle, the first and second outputs to represent the first and second slower controls, respectively, causing a cycle time of the output clock to increase in the next cycle.

24. The method of claim 23, wherein, in an event an indication of expected usage of at least one other circuit in a next cycle changes state in the present cycle and the first and second outputs are configured, in the present cycle, to represent the first and second calibration controls, respectively, the updating includes updating the first and second outputs to represent the first and second slower controls, respectively.

25. The method of claim 24, wherein, in an event an indication of expected usage of at least one other circuit in a next cycle changes state in a present cycle and the first and second outputs are, presently, configured to represent the first and second slower controls, respectively, the updating includes updating the first and second outputs, in the present cycle, to represent the first and second calibration controls, respectively.

26. The method of claim 22, further comprising:
adjusting the first and second calibration controls based on a calibration cycle; and
updating the first and second outputs to represent the first and second calibration controls, respectively, in response to the adjusting and based on the indication.

27. The method of claim 26, further comprising:
resetting and reloading a calibration counter with a target reference count at a start of the calibration cycle;
setting the target reference count based on the target frequency and a time window between the start of the calibration cycle and an end of the calibration cycle;
triggering the calibration counter via the output clock; and
adjusting the first and second calibration controls based on a value of the calibration counter at the end of the calibration cycle.

28. The method of claim 22, wherein the slower frequency represents a slowest frequency for a voltage below which at least one other circuit is unable to perform its intended function at the voltage.

29. The method of claim 19, wherein the ARO includes a first RO and a second RO and wherein the method further comprises:
using the first RO to reset and enable the second RO;
using the second RO to reset and enable the first RO;
counting, by a first counter, a first target number of inversions propagated along a first plurality of inverting gates, the first RO including the first plurality of inverting gates formed in a first ring;
selecting, by a first multiplexer coupled to the first RO, a given first inverting gate of the plurality of first inverting gates based on the first output;
triggering the first counter via an output of the given first inverting gate, the first counter coupled to the first multiplexer;
counting, by a second counter, a second target number of inversions propagated along a second plurality of inverting gates, the second RO including the second plurality of inverting gates formed in a second ring;
selecting, by a second multiplexer coupled to the second RO, a given second inverting gate of the plurality of second inverting gates based on the second output; and
triggering the second counter via an output of the given second inverting gate, the second counter coupled to the second multiplexer.

30. The method of claim 29, further comprising:
generating a first done signal and a second done signal by the first and second counters, respectively;
employing the first done signal to reset the second RO, reset the second counter, and re-load the second counter with the second target number;
employing the second done signal to reset the first RO, reset the first counter, and re-load the first counter with the first target number; and
setting the first and second target numbers based on a target frequency for at least one other circuit.

31. The method of claim 30, further comprising generating the output clock based on the first and second done signals.

32. The method of claim 19, wherein the ARO includes a first RO and a second RO, wherein the first RO and second RO are a first instance of the first RO and second RO and, wherein the method further comprises employing a second instance of the first RO and second RO, and wherein the first and second instances have different voltage scaling characteristics.

33. The method of claim 32, wherein the first instance is associated with a first voltage scaling characteristic, wherein the second instance is associated with a second voltage scaling characteristic, wherein the ARO is replicated in a first shadow ARO and in a second shadow ARO, and wherein the method further includes:
sourcing the output clock to at least one other circuit by the ARO;
disabling the first instance associated with the first voltage scaling characteristic and replicated in the first shadow ARO; and
disabling the second instance associated with the second voltage scaling characteristic and replicated in the second shadow ARO.

34. The method of claim 33, wherein the method further comprises:
employing the first shadow ARO to calibrate respective controls sent to the ARO for controlling inversion delay in the first instance for achieving a target frequency;
employing the second shadow ARO to calibrate respective controls sent to the ARO for controlling inversion delay in the second instance for achieving the target frequency;
employing a first pair of counters associated with the first shadow ARO and a second pair of counters associated with the second shadow ARO; and
toggling between use of the first shadow ARO and the second shadow ARO on a calibration-window-by-calibration window basis.

35. An apparatus comprising:
means for generating high and low phases of cycles of an output clock;
means for controlling durations of the high and low phases, independently, via first and second outputs, respectively; and
means for outputting the output clock.

* * * * *